United States Patent
Tanaka et al.

(10) Patent No.: US 9,257,680 B2
(45) Date of Patent: Feb. 9, 2016

(54) METHOD TO MAKE ORGANIC ELECTROLUMINESCENT ELEMENT MATERIAL

(71) Applicant: KONICA MINOLTA, INC., Tokyo (JP)

(72) Inventors: Tatsuo Tanaka, Kanagawa (JP); Hiroshi Kita, Tokyo (JP); Rie Katakura, Tokyo (JP); Hideo Taka, Tokyo (JP)

(73) Assignee: KONICA MINOLTA HOLDINGS, INC., Tokyo (JP)

( * ) Notice: Subject to any disclaimer, the term of this patent is extended or adjusted under 35 U.S.C. 154(b) by 27 days.

(21) Appl. No.: 14/268,611

(22) Filed: May 2, 2014

(65) Prior Publication Data

US 2014/0302230 A1    Oct. 9, 2014

Related U.S. Application Data

(60) Division of application No. 13/358,284, filed on Jan. 25, 2012, now abandoned, and a continuation of application No. 12/742,127, filed as application No. PCT/JP2008/069878 on Oct. 31, 2008, now abandoned.

(30) Foreign Application Priority Data

Nov. 14, 2007  (JP) ................................ 2007-295326

(51) Int. Cl.
| | |
|---|---|
| *H01L 51/56* | (2006.01) |
| *C09K 11/06* | (2006.01) |
| *H01L 51/00* | (2006.01) |
| *H01L 27/32* | (2006.01) |
| *H01L 51/50* | (2006.01) |

(52) U.S. Cl.
CPC ................ *H01L 51/56* (2013.01); *C09K 11/06* (2013.01); *H01L 51/0025* (2013.01); *H01L 51/0039* (2013.01); *H01L 51/0043* (2013.01); *C09K 2211/1425* (2013.01); *C09K 2211/1433* (2013.01); *H01L 27/3244* (2013.01); *H01L 51/006* (2013.01); *H01L 51/0037* (2013.01); *H01L 51/0059* (2013.01); *H01L 51/0071* (2013.01); *H01L 51/0081* (2013.01); *H01L 51/0085* (2013.01); *H01L 51/0086* (2013.01); *H01L 51/0087* (2013.01); *H01L 51/0088* (2013.01); *H01L 51/5012* (2013.01); *H01L 2251/308* (2013.01)

(58) Field of Classification Search
None
See application file for complete search history.

(56) References Cited

U.S. PATENT DOCUMENTS

| | | | |
|---|---|---|---|
| 2007/0082225 A1* | 4/2007 | Shinohara et al. | 428/690 |
| 2008/0093984 A1* | 4/2008 | Yoshitake et al. | 313/504 |
| 2009/0051281 A1* | 2/2009 | Inoue et al. | 313/504 |

* cited by examiner

*Primary Examiner* — Nathan T Leong
(74) *Attorney, Agent, or Firm* — Lucas & Mercanti, LLP

(57) ABSTRACT

In the present invention, provided is an organic electroluminescent element material having a high externally taking-out quantum efficiency, which is suitable for manufacturing an element exhibiting long light emission lifetime, and also provided is an organic electroluminescent element possessing the material, a method of manufacturing the organic electroluminescent element, and a display as well as an illuminating device fitted with the organic electroluminescent element.

2 Claims, 3 Drawing Sheets

LIGHT

METHOD TO MAKE ORGANIC ELECTROLUMINESCENT ELEMENT MATERIAL

CROSS REFERENCE TO RELATED APPLICATIONS

This is a Divisional Application of U.S. application Ser. No. 13/358,284, filed Jan. 25, 2012, which was a Continuation of U.S. application Ser. No. 12/742,127, filed May 10, 2010, which was a U.S. National Phase application under 35 U.S.C. 371 of International Application PCT/JP2008/069878, filed Oct. 31, 2008, which claims the priority of Japanese Application No. 2007-295326, filed Nov. 14, 2007, the entire content of all four applications are hereby incorporated by reference.

TECHNICAL FIELD

The present invention relates to an organic electroluminescent element material, an organic electroluminescent element, a method of manufacturing an organic electroluminescent element, a display device and an illuminating device.

BACKGROUND

As an emission type electronic displaying device, there is an electroluminescent display (hereinafter referred to as ELD). As devices constituting the ELD, there are mentioned an inorganic electroluminescent element and an organic electroluminescent element (hereinafter referred to as organic EL element).

The inorganic electroluminescent element has been used for a plane-shaped light source, but a high voltage alternating current has been required to drive the element.

An organic EL element has a structure in which a light emission layer containing a light emission compound is arranged between a cathode and an anode, and an electron and a hole are injected into the light emission layer and recombined to form an exciton. The element emits light, utilizing light (fluorescent light or phosphorescent light) generated by inactivation of the exciton, and the element can emit light by applying a relatively low voltage of from several volts to several decade volts. The element has a wide viewing angle and high visualization since the element is of self light emission type. Further, the element is a thin, complete solid device, and therefore, the element is noted from the viewpoint of space saving and portability.

However, development of an organic EL element for practical use is demanded which efficiently emits light with high luminance at a lower power.

High emission luminance and long lifetime is attained in Japanese Patent No. 3093796 by doping a slight amount of a phosphor in stilbene derivatives, distyrylarylene derivatives or tristyrylarylene derivatives.

An element is known which comprises an organic light emission layer containing an 8-hydroxyquinoline aluminum complex as a host compound doped with a slight amount of a phosphor in Japanese Patent O.P.I. Publication No. 63-264692, and an element is known which comprises an organic light emission layer containing an 8-hydroxyquinoline aluminum complex as a host compound doped with a quinacridone type dye in Japanese Patent O.P.I. Publication No. 3-255190.

When light emitted through excited singlet state is used as in the above, the upper limit of externally taking-out quantum efficiency ($\eta$) is considered to be at most 5%, as the generation ratio of singlet excited species to triplet excited species is 1:3, that is, the generation probability of excited species capable of emitting light is 25%, and further, external light emission efficiency is 20%.

Since an organic EL element, employing phosphorescence through the excitation triplet, was reported by Prinston University (see M. A. Baldo et al, Nature, 395, p. 151-154 (1998)), study on materials emitting phosphorescence at room temperature has been actively made.

For example, such an organic EL element is disclosed in M. A. Baldo et al., Nature, 403, 17, p. 750-753 (2000) or U.S. Pat. No. 6,097,147.

As the upper limit of the internal quantum efficiency of the excitation triplet is 100%, the light emission efficiency of the excitation triplet is theoretically four times that of the excited singlet. Such an organic EL element has possibility that exhibits the same performance as a cold cathode tube, and its application to illumination is watched.

Many compounds, mainly heavy metal complexes such as iridium complexes are synthesized and studied in for example, S. Lamansky et al, J. Am. Chem. Soc., 123, 4304 (2001).

An example employing tris(2-phenylpyridine)iridium as a dopant is studied in M. A Baldo et al, Nature, 403, 17, p. 750-753 (2000) above.

Further, M. E. Tompson et at studies an example employing as a dopant $L_2Ir(acae)$ such as $(ppy)_2Ir$ (acac) in The $10^{th}$ International Workshop on Inorganic and Organic Electroluminescence (EL '00, Hamamatsu), and Moon-Jae You n. Og, Tetsuo Tsutsui et at an example employing as a dopant tris(2-p-tolylpyridine)iridium $\{Ir(ptpy)_3\}$ or tris(benzo-N-quinoline)iridium $\{Ir(bzq)_3\}$ in The $10^{th}$ International Workshop on Inorganic and Organic Electroluminescence (EL '00, Hamamatsu). In addition, these metal complexes are generally called orthometalated iridium complexes.

As described above, attempt for preparing an element employing various iridium complexes is made in S. Lamansky et al, J. Am. Chem. Soc., 123, 4304 (2001) or in Japanese Patent O.P.I. Publication No. 2001-247859.

Further, to obtain high emission efficiency, Ikai et al utilized a hole transporting compound as a host of a phosphorescent compound at The 10th International Workshops on Inorganic and Organic Electroluminescence (EL'00, Hamamatsu). Further, M. E. Tompson et al. utilized various types of electron transporting materials doped with a new iridium complex as a host of a phosphorescent compound.

An organic EL element fitted with the iridium complex is prepared generally via evaporation. Studies of an organic EL element prepared by a coating method have been actively done, but it is presently difficult to prepare the organic EL element via coating since the iridium complex exhibits low solubility. Thus, it is desired to improve solubility of the iridium complex.

Further, orthometalated complexes in which iridium as a center metal is replaced by platinum are also watched. Regarding these complexes, there are known many kinds of complexes having characteristics in the ligands, which are disclosed in Japanese Patent O.P.I. Publication Nos. 2002-332291, 2002-332292, 2002-338588, 2002-226495, and 2002-234894, for example.

Light emission elements employing the above compounds exhibit greatly unproved emission luminance and emission efficiency as compared to conventional elements, because the light emission arises from phosphorescence, but they have a problem in that emission lifetime is low as compared to conventional elements. In this way, in the case of a light emitting material exhibiting high phosphorescence efficiency, it is difficult to improve realization of shorter light emission wavelength as well as emission lifetime, whereby presently, practically sufficient tolerable performance has not yet been achieved.

As a material to improve the performance, for example, known is an Ir complex or a Pt complex each having a phenyl imidazole derivative as a ligand in WO 02/15645 and WO 05/7767. However, light emission efficiency and lifetime of the element of each of these complexes are not sufficiently satisfactory, and further improvement of the light emission efficiency and the lifetime are desired to be improved.

A vacuum evaporation method is conventionally utilized as a method of manufacturing an organic EL element, but since in the case of the conventional vacuum evaporation method, high vacuum is required forte operation, the manufacturable member is limited in size, and a step of taking a member in and out is also required at the same time. Thus, the conventional vacuum evaporation method is rejected as unsuitable for the continuous production.

On the other hand, as a continuously manufacturable means, a method of employing an EL material solution is disclosed (refer to Patent Document 1, for example), and a low-molecular material and a polymeric material are to be usable as the EL material.

However, in the case of coating with a low-molecular material, a lower layer and an upper layer are difficult to be incorporated during formation of a multilayer, resulting in difficulty of obtaining an EL element exhibiting high performance.

Further in the case of a polymeric material, there appears a problem such that a refining method available with a low-molecular material such as a recrystallization method, a sublimation refining method, and a silica column refining method cannot be utilized, and impurities contained in a monomer as raw material to prepare a polymer are difficult to be removed. Thus, this reason leads to a factor to degrade light emission lifetime.

Patent Document 1: Japanese Patent O.P.I. Publication No. 2001-297882

DISCLOSURE OF THE INVENTION

Problems to be Solved by the Invention

It is an object of the present invention to provide an organic electroluminescent element material having a high externally taking-out quantum efficiency, which is suitable for manufacturing an element exhibiting long light emission lifetime, and also to provide an organic electroluminescent element possessing the material, a method of manufacturing the organic electroluminescent element, and a display as well as an illuminating device fitted with the organic electroluminescent element.

Means to Solve the Problems

The above-described object of the present invention is accomplished by the following Structures.

(Structure 1) An organic electroluminescent element material comprising a synthesized polymer from at least one monomer having an impurity content of 1000 ppm or less.

(Structure 2) The organic electroluminescent element material of Structure 1, wherein the at least one monomer has an impurity content of 100 ppm or less.

(Structure 3) The organic electroluminescent element material of Structure 1 or 2, wherein the at least one monomer comprises a reactive substituent.

(Structure 4) The organic electroluminescent element material of any one of Structures 1-3, the polymer comprises a partial structure represented by the following Formula (1):

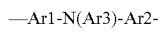

—Ar1-N(Ar3)-Ar2—      Formula (1)

wherein each of Ar1 and Ar2 independently represents an arylene group or a heteroarylene group, and Ar3 represents an aromatic hydrocarbon group or an aromatic heterocyclic group.

(Structure 5) An organic electroluminescent element comprising the organic electroluminescent element material of any one of Structures 1-4.

(Structure 6) The organic electroluminescent element of Structure 5, comprising a phosphorescence emission compound.

(Structure 7) The organic electroluminescent element of Structure 5 or 6, prepared with a solution comprising the organic electroluminescent element material of any one of Structures 1-4.

(Structure 8) The organic electroluminescent element of any one of Structures 5-7, producing white light emission.

(Structure 9) A method of manufacturing an organic electroluminescent element, comprising the step of using a reaction solution for a polymer to be synthesized from at least one monomer having an impurity content of 1000 ppm or less to prepare the organic electroluminescent element of any one of Structures 5-8.

(Structure 10) A display device comprising the organic electroluminescent element of any one of Structures 5-8.

(Structure 11) An illuminating device comprising the organic electroluminescent element of any one of Structures 5-8.

Effect of the Invention

In the present invention, provided can be an organic electroluminescent element material having a high externally taking-out quantum efficiency, which is suitable for manufacturing an element exhibiting long light emission lifetime, and also provided can be an organic electroluminescent element possessing the material, a method of manufacturing the organic electroluminescent element, and a display as well as an illuminating device fitted with the organic electroluminescent element.

EXPLANATION OF NUMERALS

Figure 1:
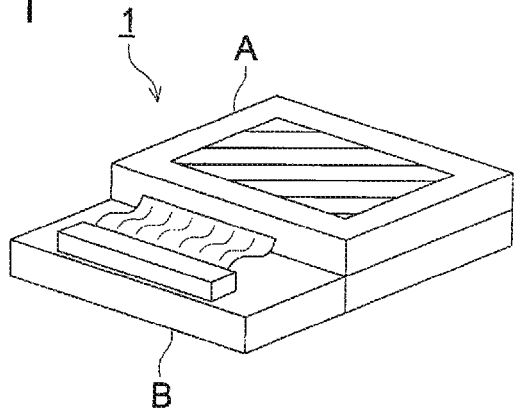
FIG. 1 is a schematic diagram showing an example of a display device composed of an organic EL element.

1 Display
3 Pixel
5 Scanning line
6 Data line
7 Power supply line
10 Organic EL element
11 Switching transistor 12 Drive transistor
13 Condenser
A Display section
B Control section
101 Organic EL element
102 Glass cover
105 Cathode
106 Organic EL layer
107 Glass substrate provided with transparent electrode
108 Nitrogen gas
109 Water refilling agent

DESCRIPTION OF THE PREFERRED EMBODIMENTS

As to an organic electroluminescent element material of Structure 1 or 2 in the present invention, provided is a polymer synthesized from at least one monomer having an impurity content of 1000 ppm or less, or an organic electroluminescent element material containing a synthesized polymer from at least one monomer having an impurity content of 1000 ppm or less, and also provided can be an organic electroluminescent element exhibiting high externally taking-out quantum efficiency and long light emission lifetime via use of the foregoing element material, and a display device and an illuminating device fitted with the foregoing element.

Next, each of constituent elements in the present invention will be described is detailed in order.

<<Monomer Having Impurity Content of 1000 Ppm or Less>>

A monomer having comprised in an organic electroluminescent element material of the present invention will be described.

The monomer of the present invention is referred to also as an organic compound having a reactive substituent, and has an impurity content of 1000 ppm or less, but preferably has an impurity content of 100 ppm or less.

Herein, to achieve the impurity content of 1000 ppm or less means that a monomer of the present invention (an organic compound having a reactive substituent) is designed to have a purity content of 99.9% by weight or more.

In the present invention, it is inhibited by using an organic electroluminescent element material containing a high-purity polymer synthesized from the above-described high-purity monomer (organic compound having a reactive substituent) to contain the impurity to possibly induce poor performance variation of an organic electroluminescent element, whereby light emission efficiency and lifetime of the element become possible to be largely improved.

{Measurement of Impurity Content (Referred to Also as Measurement of Polymer Purity)}

The purity of a monomer of the present invention (an organic compound having a reactive substituent) can be measured and determined by a commercially available HPLC (high performance liquid chromatography).

The monomer purity measured by HPLC will be described in detail in synthetic examples of the after-mentioned monomer.

(Reactive Substituent)

The reactive substituent of the present invention will be described.

Specific examples of the reactive substituent of the present invention include groups each having the following partial structure.

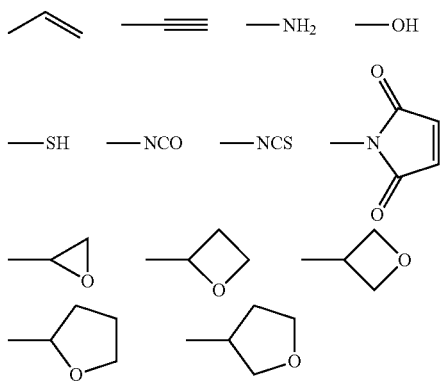

As organic compounds each having the above-described reactive substituent, preferable compounds are those having the above-described reactive group as mother compounds such as compounds used for forming a host compound, an emission dopant, a fluorescence dopant, an election injection layer and a hole injection layer, compounds used for forming a hole blocking layer and an electron blocking layer, compounds used for forming a hole transport layer, and compounds used for forming an electron transport layer, which are utilized to form a constituent layer of the after-mentioned organic electroluminescent element (organic EL element).

Further, these can also be appropriately selected from compounds described as a hole transport material, an electron blocking material, an emission host (referred to as a host compound), an emission dopant (referred to simply as a dopant), an electron transport material and a hole blocking material, and compounds disclosed in patent documents.

Specific examples of the compound having a reactive substituent are shown below, but the present invention is not limited thereto.

1-1

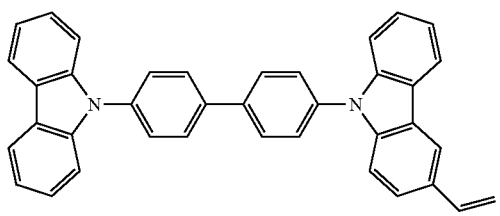

1-2

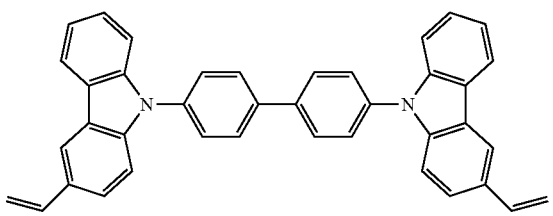

-continued
1-3
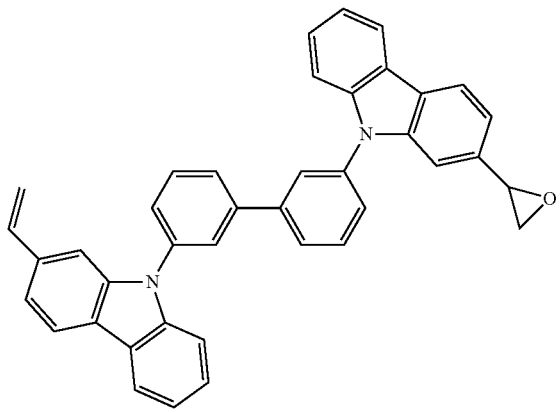
1-4
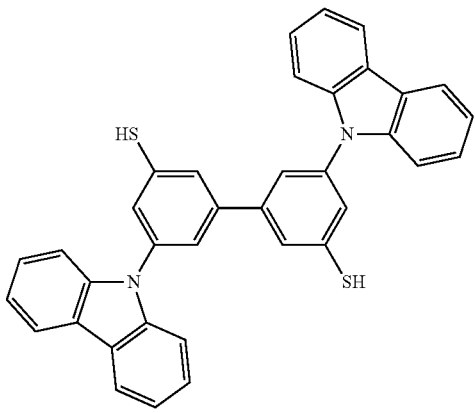
1-5
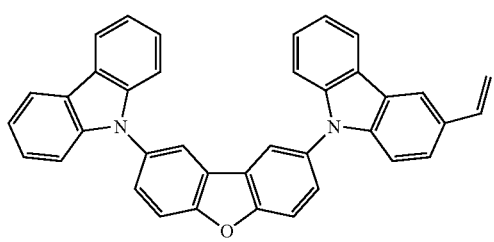
1-6
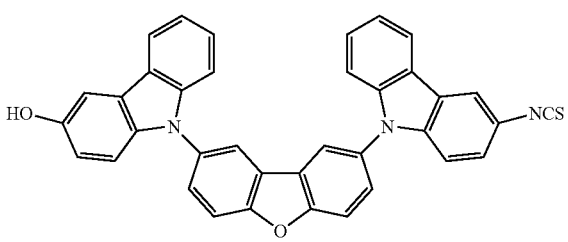
1-7
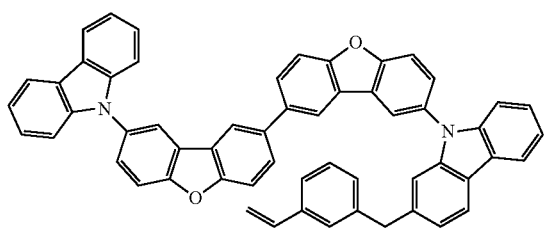
1-8
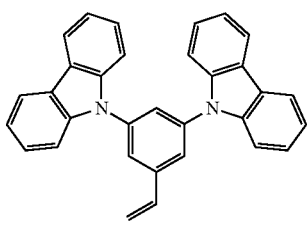
1-9
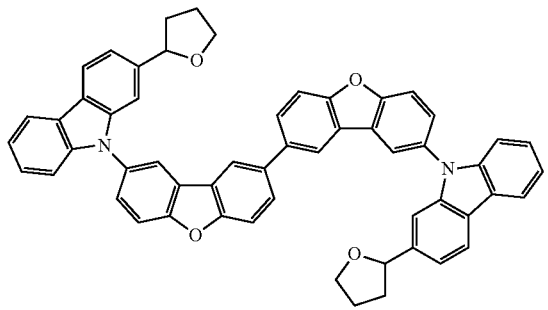
1-10
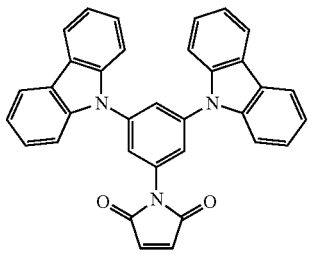
1-11
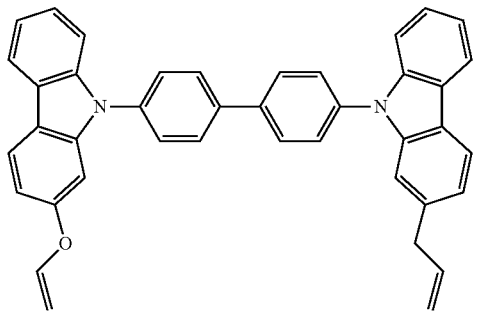
1-12
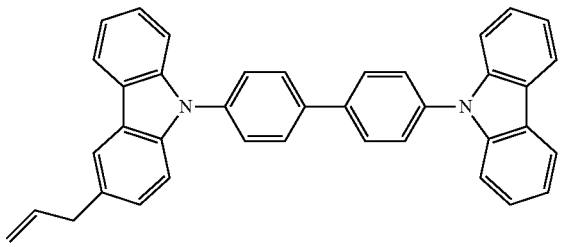

-continued
1-13
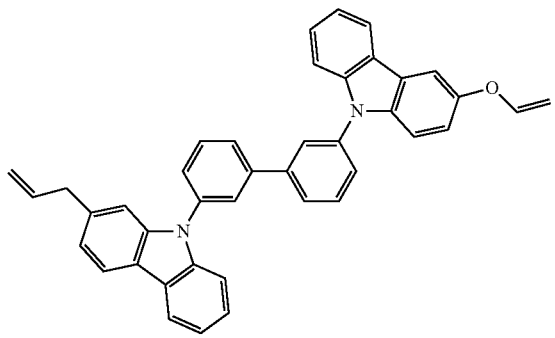
1-14
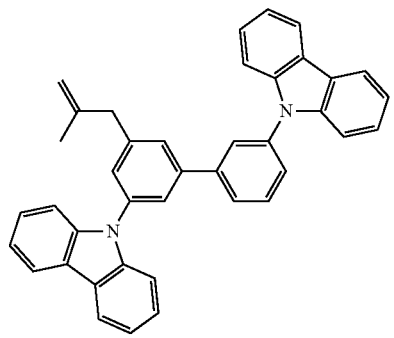
1-15
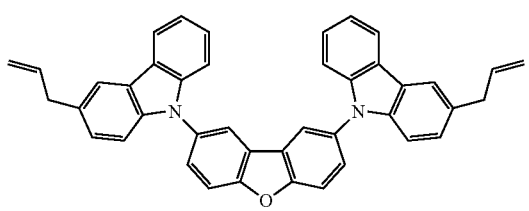
1-16
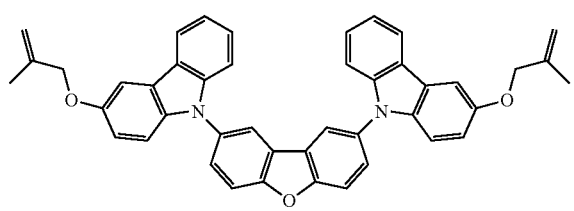
1-17
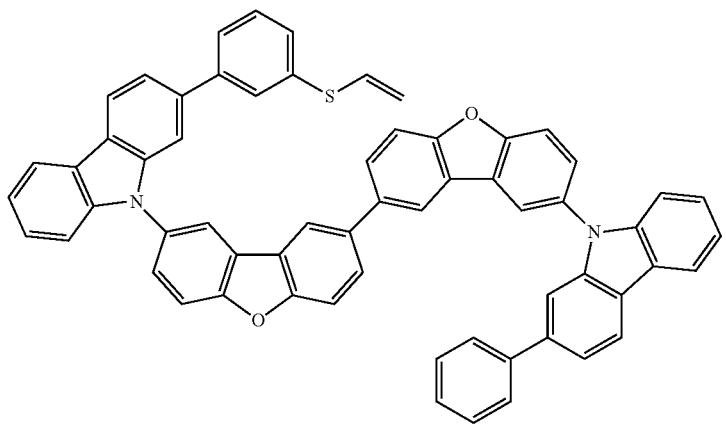
1-18
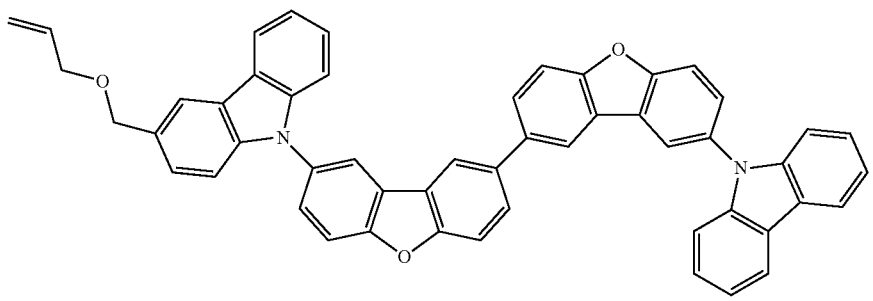
1-19
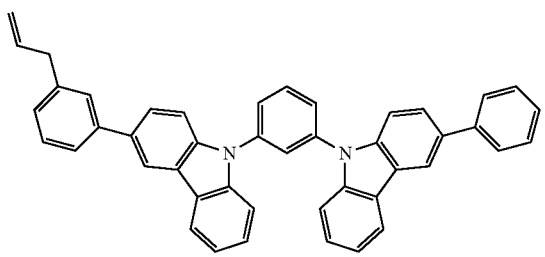
1-20
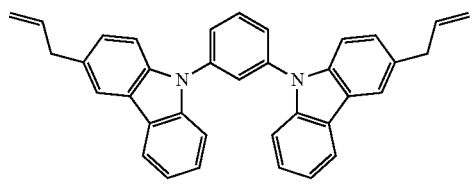

-continued
1-21
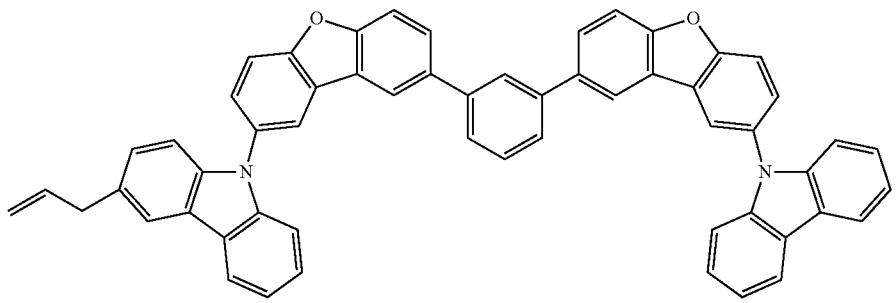
1-22
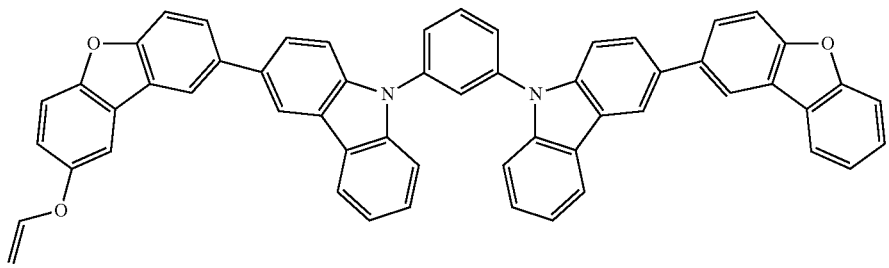
1-23
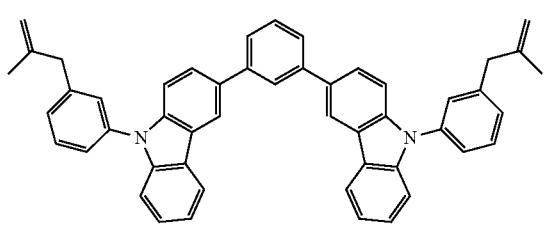
1-24
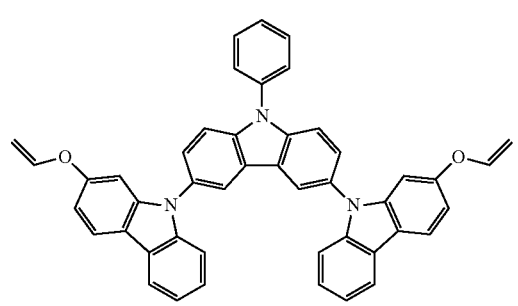
1-25
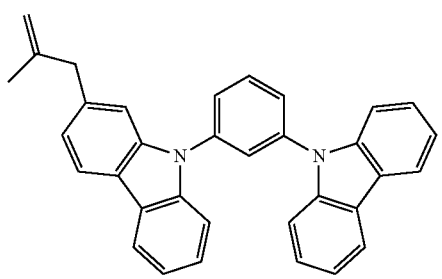
1-26
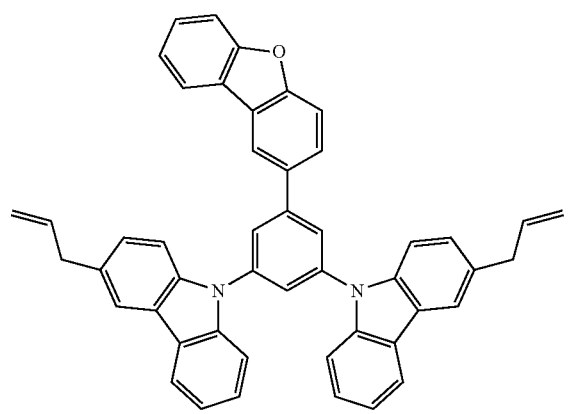
2-1
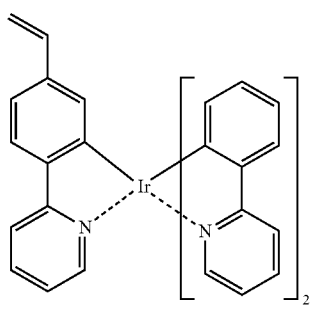
2-2
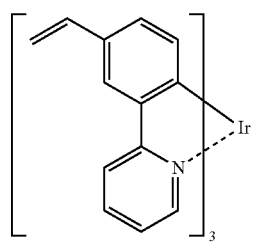

-continued
2-3
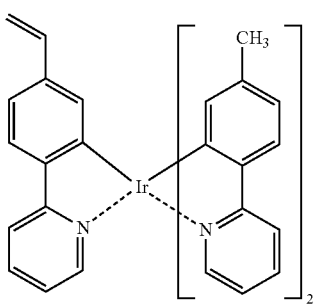
2-4
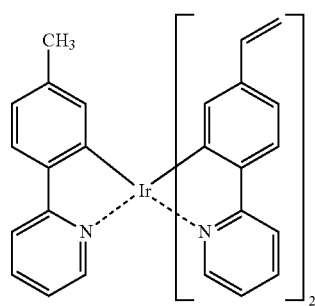
2-5
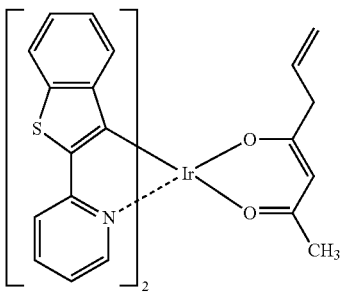
2-6
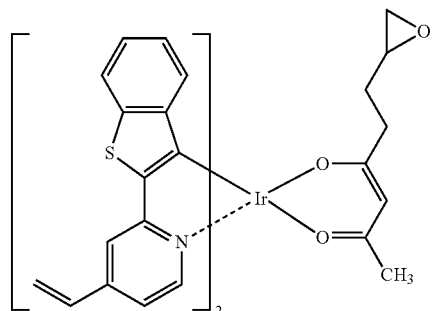
2-7
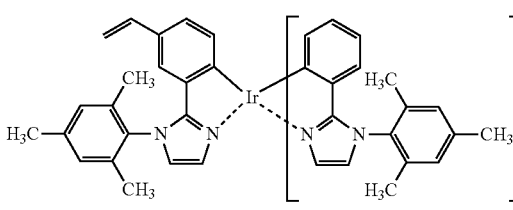
2-8
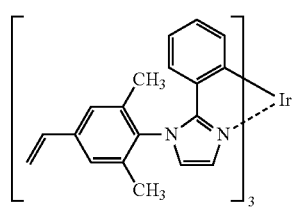
2-9
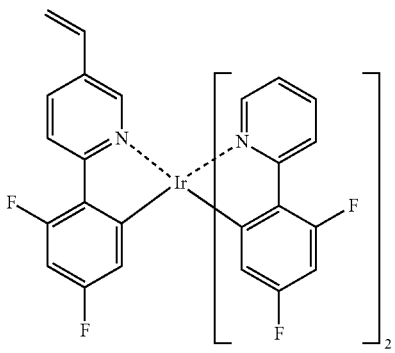
2-10
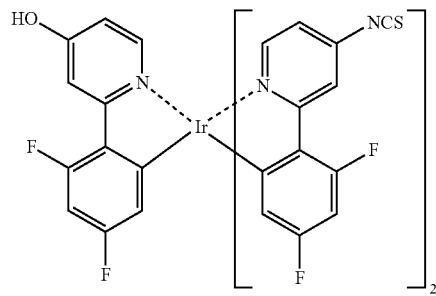
2-11
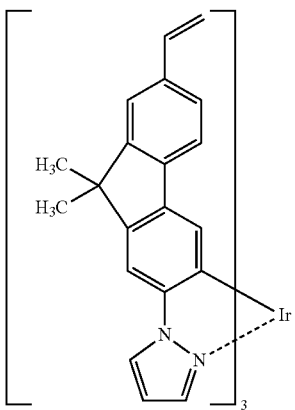
2-12
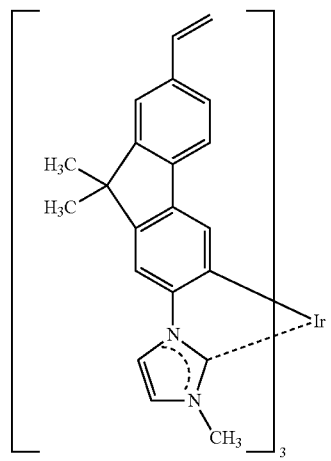

-continued
2-13
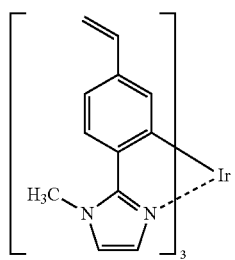
2-14
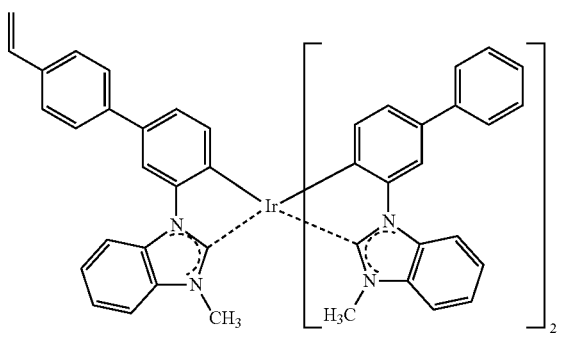
2-15
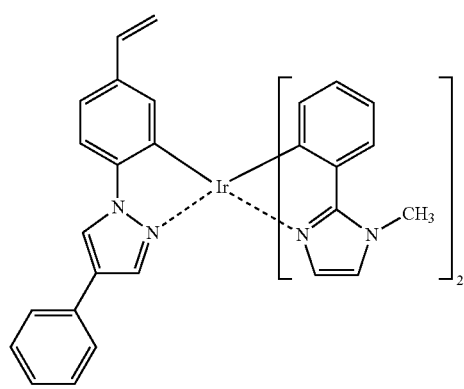
2-16
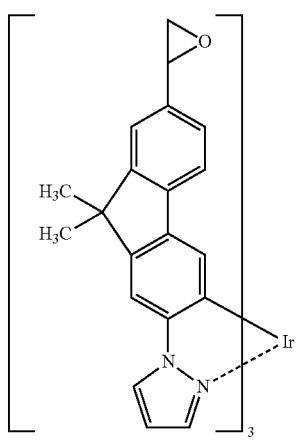
2-17
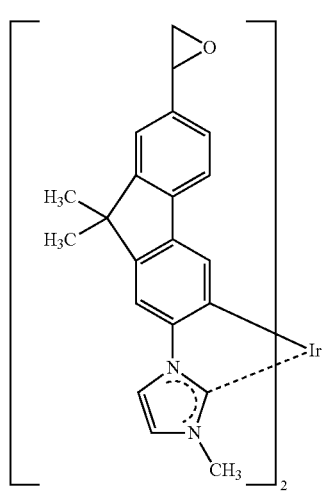
2-18
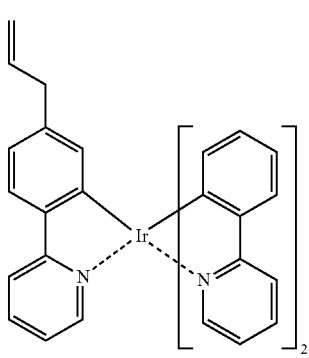
2-19
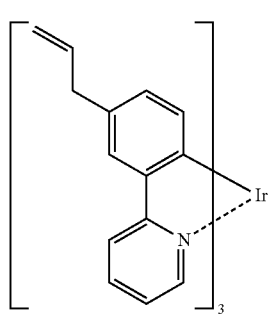
2-20
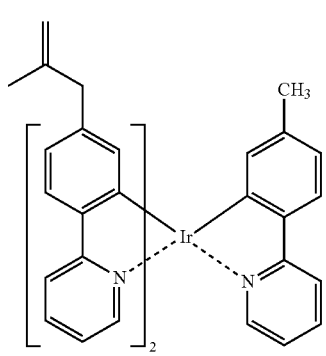

-continued
2-21
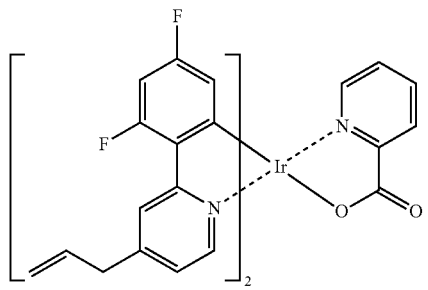
2-22
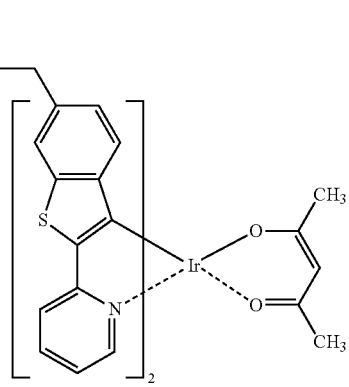
2-23
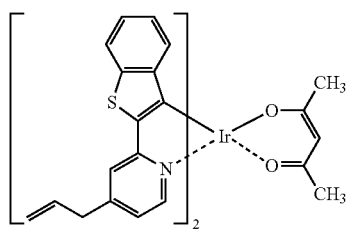
2-24
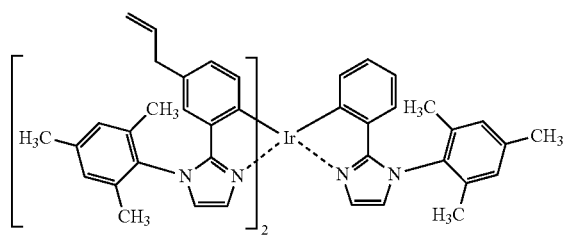
2-25
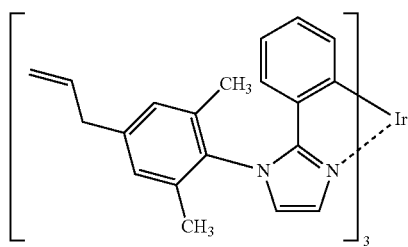
2-26
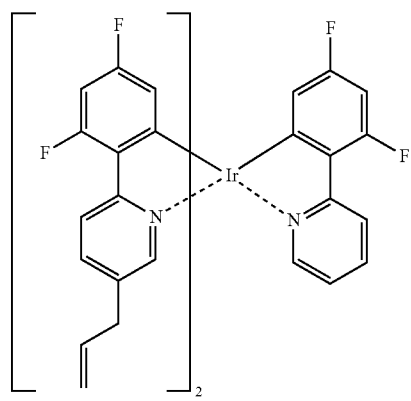
2-27
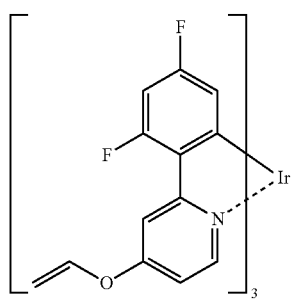
2-28
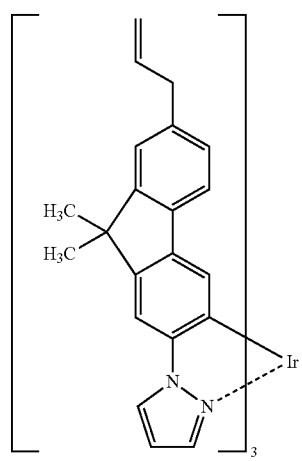

-continued
2-29
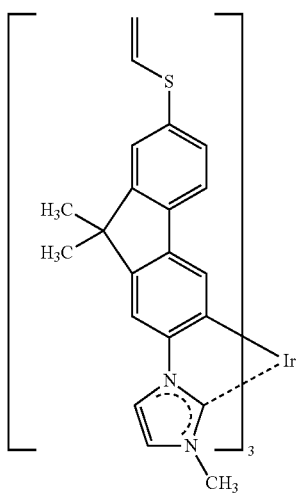
2-30
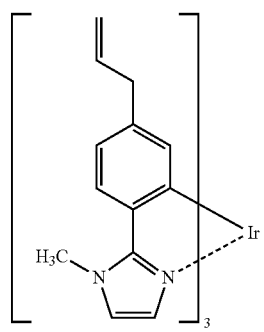
2-31
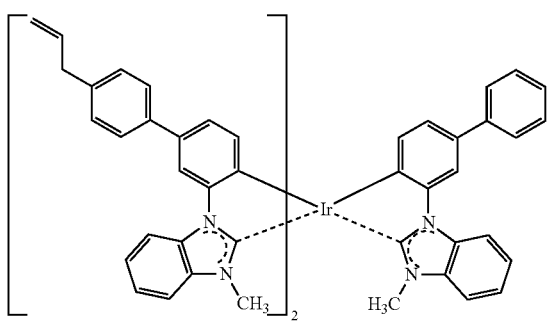
2-32
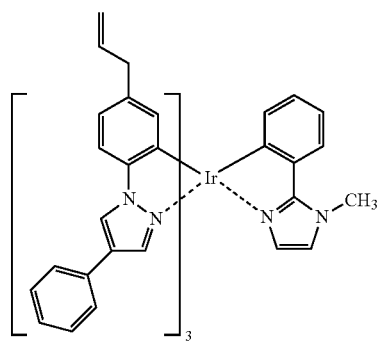
2-33
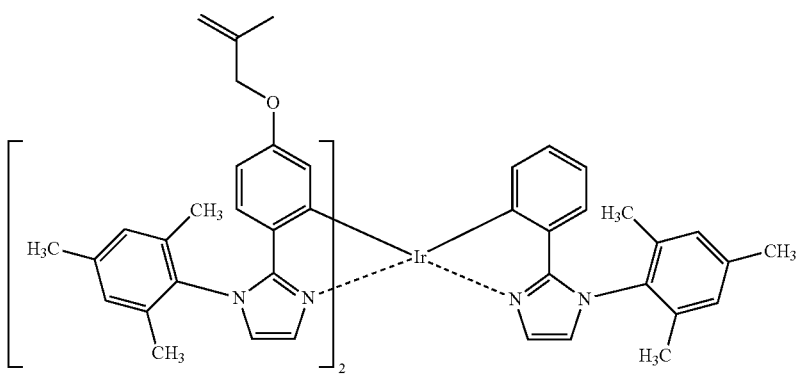
3-1
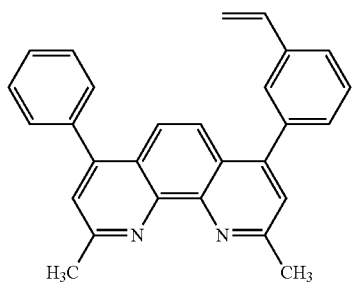
3-2
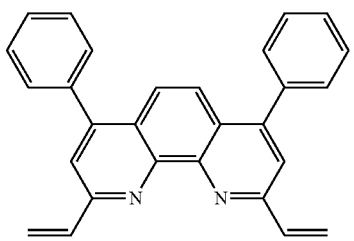

-continued
3-3
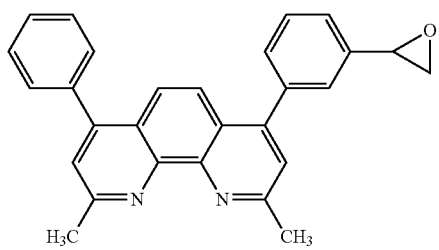
3-4
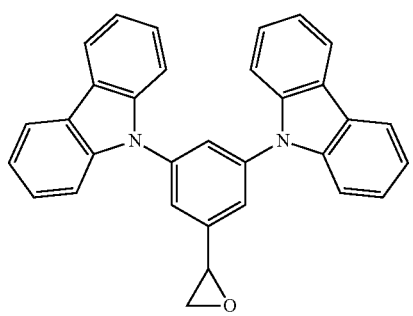
3-5
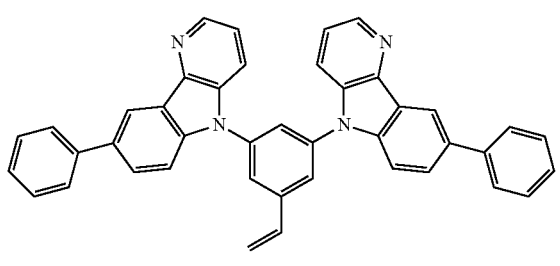
3-6
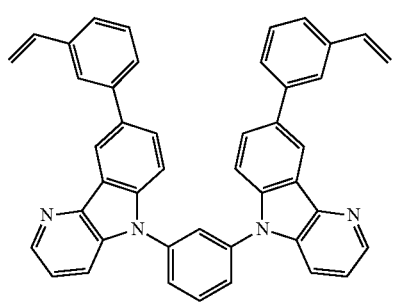
3-7
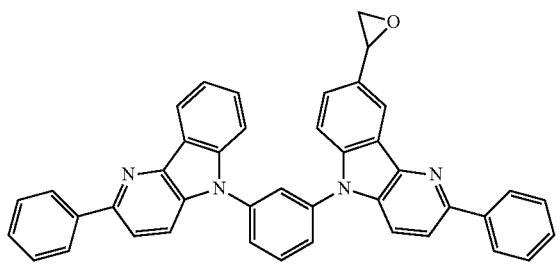
3-8
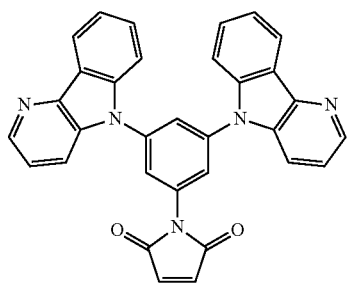
3-9
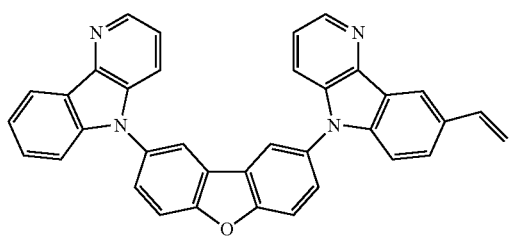
3-10
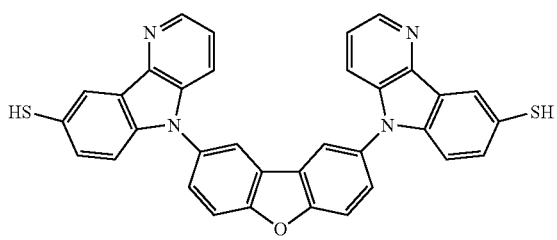
3-11
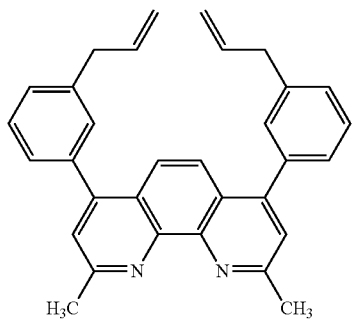
3-12
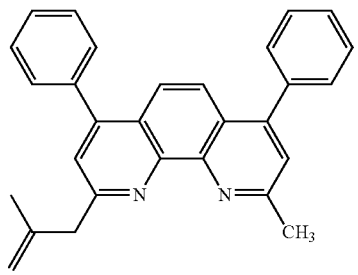

-continued
3-13
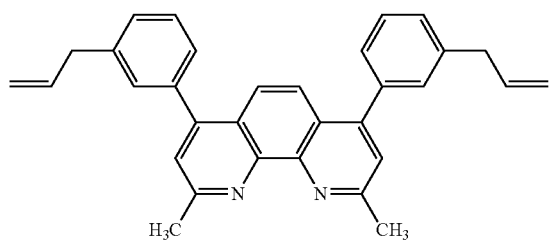
3-14
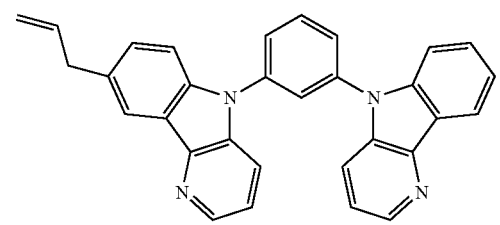
3-15
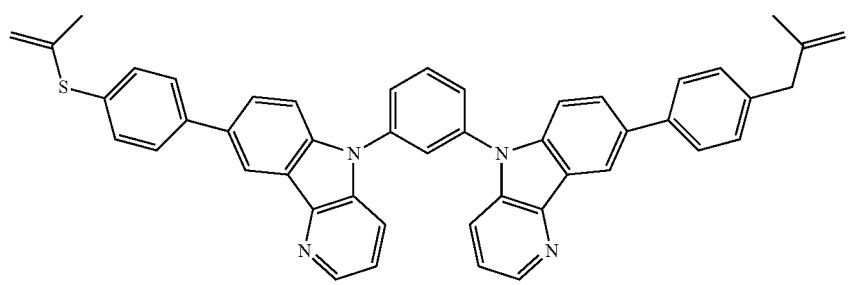
3-16
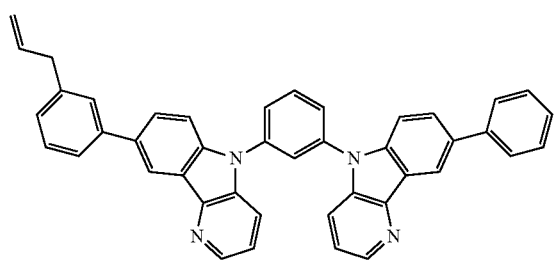
3-17
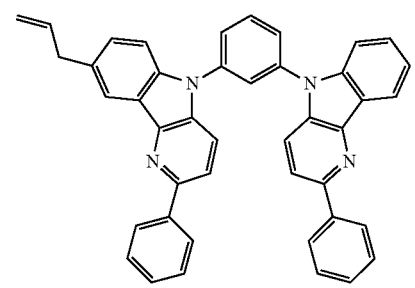
3-18
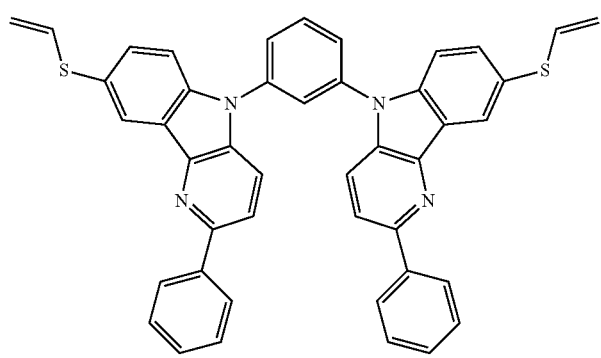
3-19
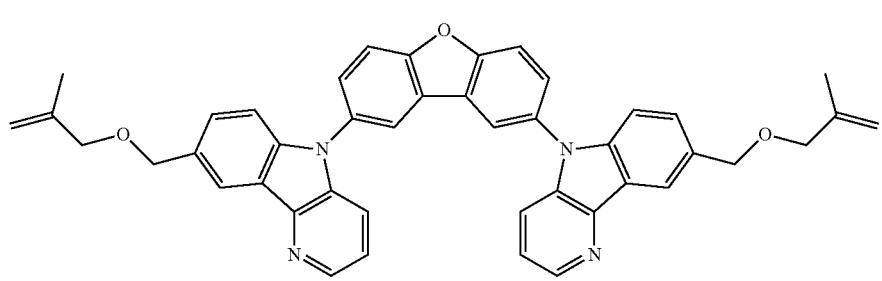

-continued
3-20
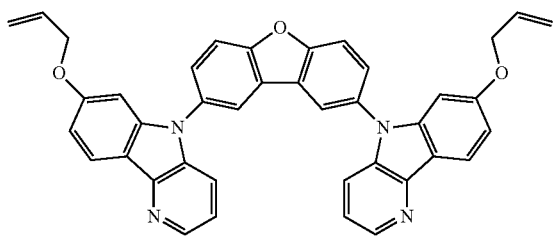
3-21
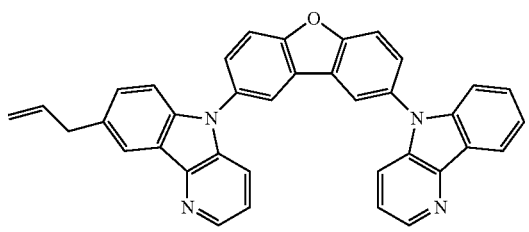
4-1
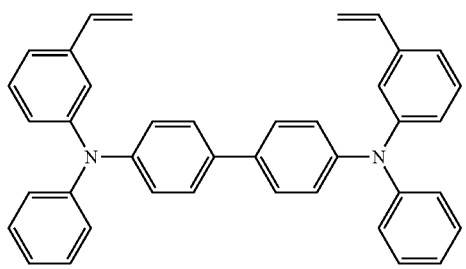
4-2
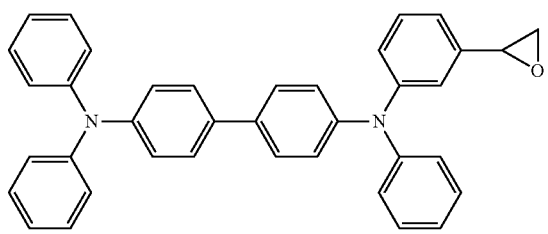
4-3
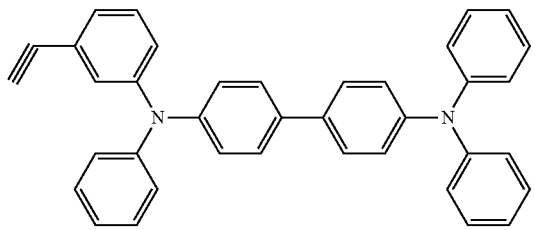
4-4
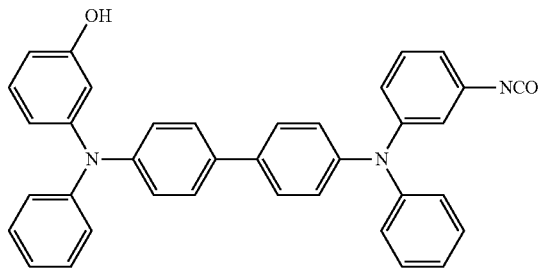
4-5
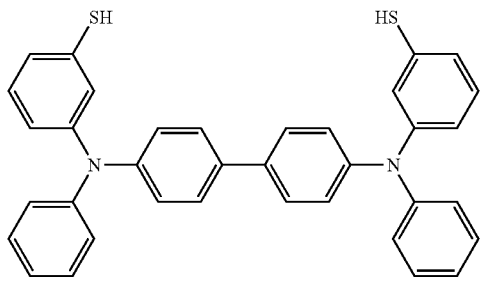
4-6
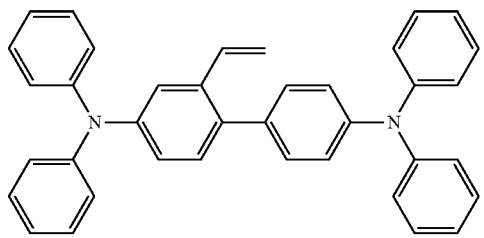
4-7
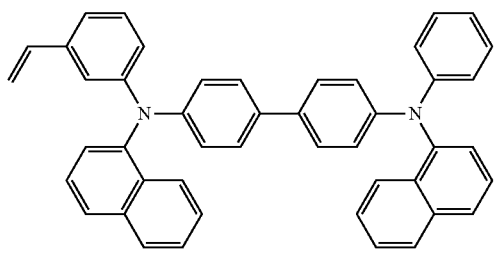
4-8
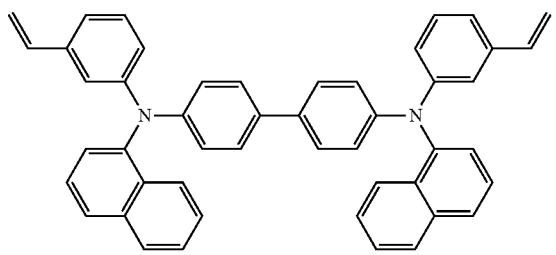

-continued
4-9
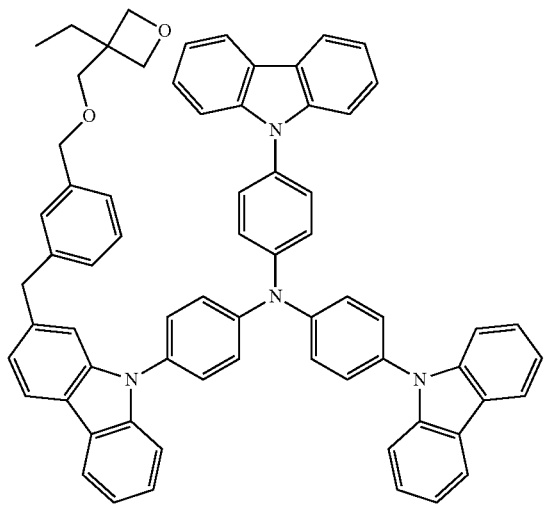
4-10
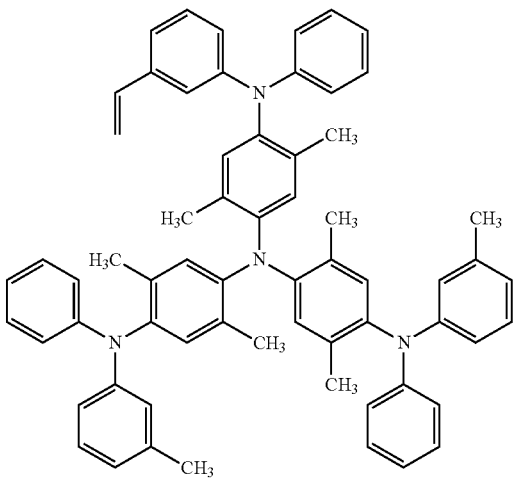
4-11
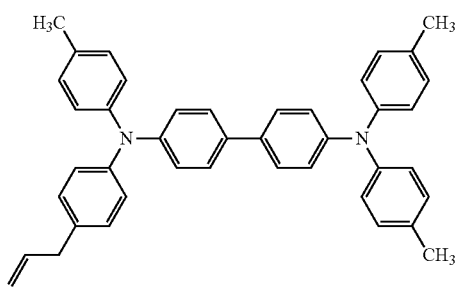
4-12
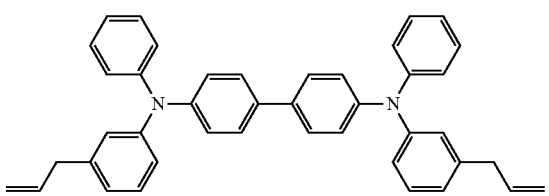
4-13
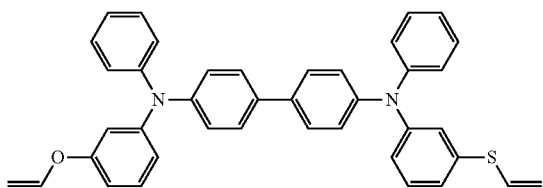
4-14
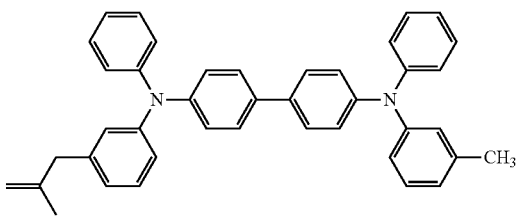
4-15
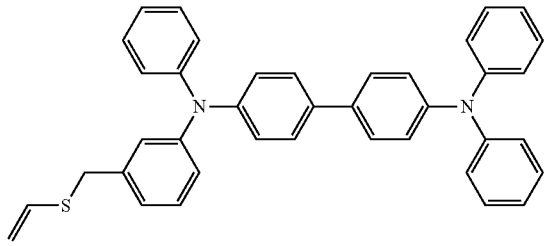
4-16
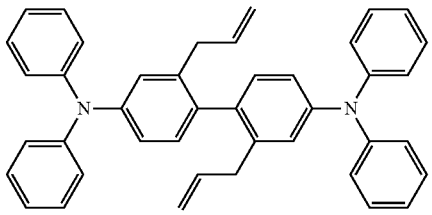
4-17
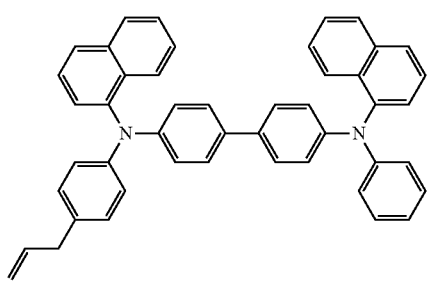
4-18
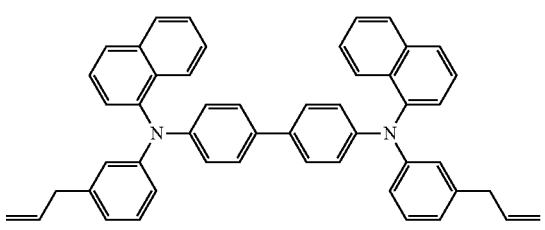

4-19
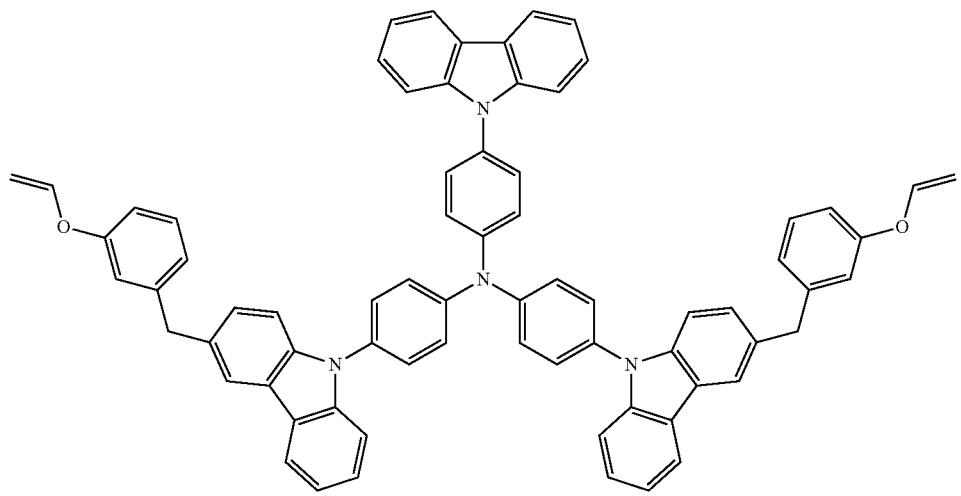
4-20
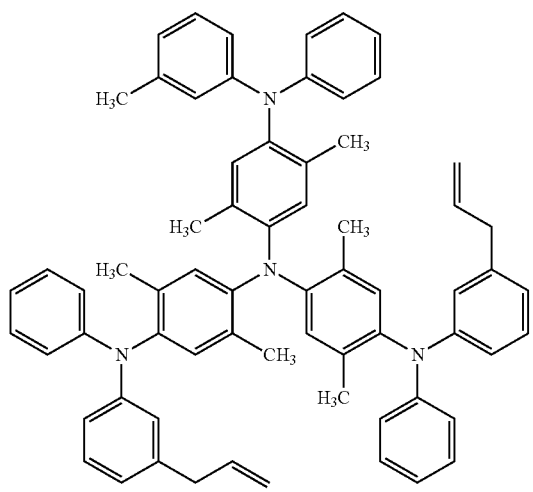
Next, a synthetic example of the monomer relating to an organic electroluminescent element material of the present invention (an organic compound having a reactive substituent) will be shown, but the present invention is not limited thereto.
Synthetic Example
Synthesis of Compound 1-2
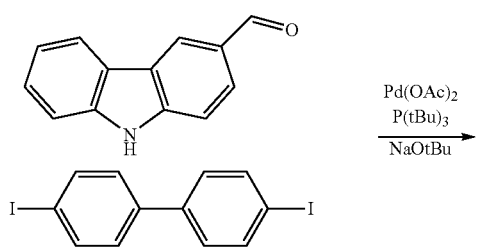
-continued
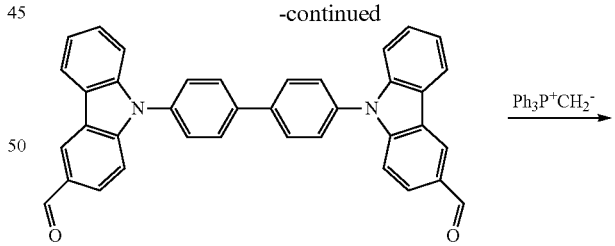
1-2(formyl)
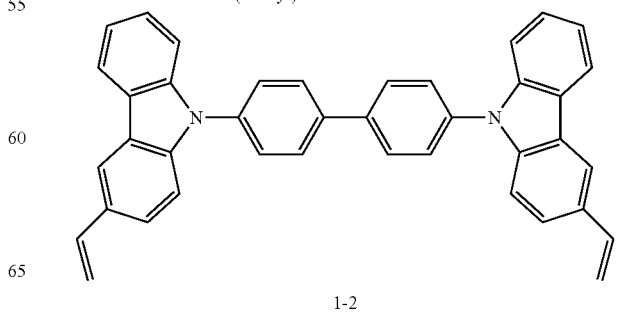
1-2

Into a 200 mL three-necked flask, added were 0.5 g of palladium acetate, 100 mL of xylene, and 1.0 g of tri-tert-butylphosphine, and the system was replaced by introducing nitrogen, followed by stirring at room temperature for 30 minutes. Thereafter, 5.2 g of 4,4'-diiodobiphenyl, 5.0 g of 3-formylcarbazole (compound described in J. Chem. Soc., 1957, 2210-2212), and 3.0 g of tert-buthoxy sodium were added therein, and heated to reflux for 5 hours.

After completing the reaction, the system was cooled to mom temperature, and an insoluble substance was removed via diatomite filtration. It was washed with saturated saline and dried with sodium sulfate, and was subsequently concentrated at reduced pressure with a rotary evaporator.

A residue was purified by silica gel chromatography to obtain 5.5 g of compound 1-2 as a formyl substance {referred to also as compound 1-2 (formyl)}.

Next, 4.0 g of methyltriphenylphosphonium bromide and 80 mL of tetrahydrofuran were added in a 200 mL three-necked flask, and the inside of the system was cooled to −70° C. or less after replacing the reaction system with nitrogen. Then, after 6.0 mL of a 2 mol/L LDA were added into the system, it was once raised up to a temperature of 0° C.

After cooling this reaction system to −70° C. or less again, 20 mL of a THF solution obtained from 5.5 g of compound 1-2 as a formyl substance {referred to also as compound 1-2 (formyl)} were dropped at −70° C. or less while stirring for one hour.

After completion of stirring, the system was heated back to mom temperature. The reaction solution was washed with saturation saline, dried with magnesium sulfate, and subsequently concentrated at reduced pressure with a rotary evaporator.

The residue was purified by silica gel chromatography to obtain 2.2 g of a white solid, and it was confirmed via determination of the mass-spectrum and $^1$H-NMR spectrum that the resulting was compound 1-2.

(Preparation of Compound 1-2 Having Different Purity Content)

The purity of this target material was measured via HPLC, resulting in a purity content of 96.30% (compound 1-2a). This white solid was purified again via silica gel chromatography, resulting in a purity content of 98.02% (compound 1-2b) obtained via HPLC.

Recrystallization was subsequently repeated 3 times ($1^{st}$ time: a purity content of 99.53% obtained via HPLC (compound 1-2c), $2^{nd}$ time: a purity content of 99.92% obtained via HPLC (compound 1-2d), and $3^{rd}$ time: a purity content of 99.99% obtained via HPLC (compound 1-2d). Compounds 1-2 each having a different purity content were obtained.

Next, the measurement conditions of HPLC employed in the present invention are shown below.

Measurement Conditions of HPLC

Measuring apparatus: LC 2000 Series (manufactured by Japan Analytical Industry Co., Ltd)
Utilized column: ODS-3 (GL Science)
Developing solvent: acetonitrile/water=3/7
Developing flow: 1 mL/min
Temperature: 40° C.
Detection wavelength: 254 nm A monomer having an impurity content of 1000 ppm in the present invention (referred to also as an organic compound having a reactive substituent) can be synthesized by using, for example, a method disclosed in Japanese Patent O.P.I. Publication No. 2004-327454 or the reference described in the foregoing documents.

Polymer Having Partial Structure Represented by Formula (1)

Further, a polymer of the present invention, synthesized by using at least one monomer having an impurity content of 1000 ppm or less, preferably has a partial structure represented by foregoing Formula (1).

Examples of an arylene group independently represented at each of Ar1 and Ar2 in Formula (1) include an o-phenylene group, a m-phenylene group, a p-phenylene group, a naphthalenediyl group, an anthracenediyl group, a naphthacenediyl group, a pyrenediyl group, a naphthylnaphthalendiyl group, a biphenyldiyl group (for example, a [1,1'-biphenyl]-4,4'-diyl group and a 3,3'-biphenyldiyl group, and a 3,6-biphenyldiyl group), terphenyldiyl group, quaterphenyldiyl group, a quinquephenyldiyl group, a sexiphenyldiyl group, a septiphenyldiyl group, an octiphenyldiyl group, a nobiphenyldiyl group, and a deciphenyldiyl group. Further, The foregoing arylene group may also have a substituent.

As the heteroarylene group independently represented at each of Ar1 and Ar2 in Formula (1), provided is a divalent group derived from the group consisting of a carbazole group, a carboline ring a diazacarbazole ring (also referred to as a monoazacarboline group, indicating a ring structure formed in such a manner that one of the carbon atoms constituting the carboline ring is replaced with a nitrogen atom), a triazole ring, a pyrrole ring, a pyridine ring a pyrazine ring, a quinoxaline ring, a thiophene ring, an oxadiazole ring, a dibenzofuran ring a dibenzothiophene ring and an indole ring.

Further, The foregoing heteroarylene group may also have a substituent.

Examples of the aromatic hydrocarbon ring group (referred to also as aromatic hydrocarbon group or aryl group) represented at Ar3 in Formula (1) include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenyl group. These groups each may be unsubstituted, or may have a substituent.

Examples of the aromatic heterocyclic group represented at Ar3 in Formula (1) include a pyridyl group, a pyrimidinyl group, a furyl group, a pyrrolyl group, an imidazolyl group, a benzimidazolyl group, a pyrazolyl group, a pyrazinyl group, a triazolyl group (for example, a 1,2,4-triazole-1-yl group or a 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (in which one of the carbon atoms constituting the carboline ring of the carbolinyl group is substituted with a nitrogen atom), a quinoxalinyl group, a pyridazinyl group, a triazinyl group, a quinazolinyl group, and a phthalazinyl group.

These groups each may be unsubstituted, or may have a substituent.

Next, specific examples of the polymer having a partial structure represented by Formula (1) in the present invention will be shown, but the present invention is not limited thereto.

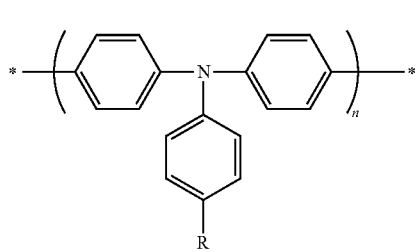
5-1: R = Bu(n)
5-2: R = n-hexyl
5-3: R = H
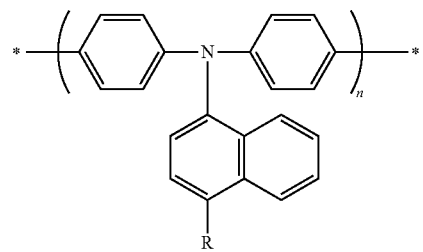
5-4: R = H
5-5: R = Bu(n)
5-6: R = n-hexyl
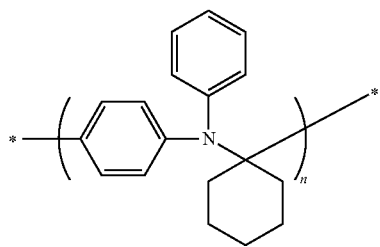
5-7
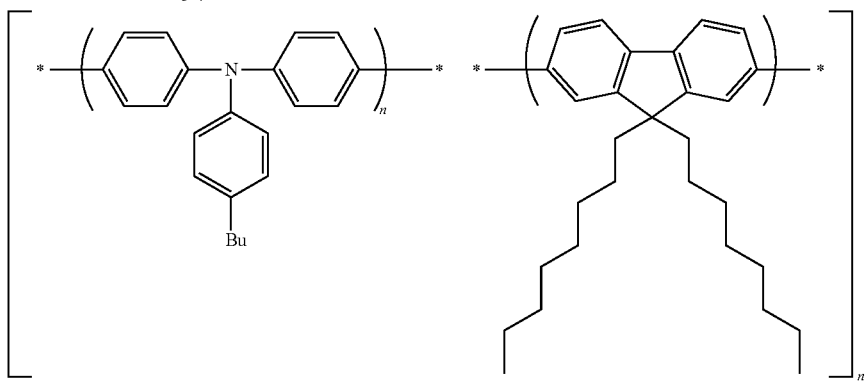
5-8
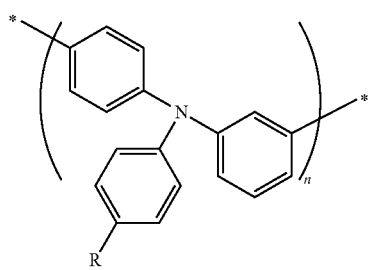
5-9: R = H
5-10: R = Bu(n)
5-11: R = n-hexyl
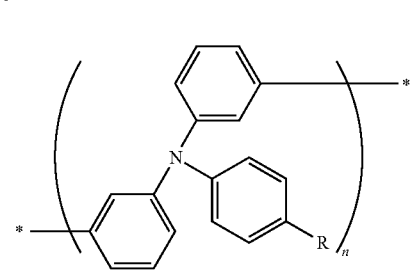
5-12: R = H
5-13: R = Bu(n)
5-14: R = n-hexyl
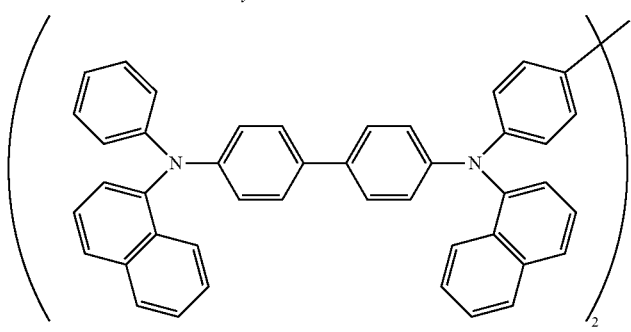
5-15
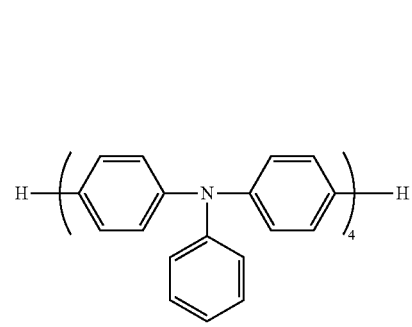
5-16

Method of Manufacturing Organic EL Element

The method of manufacturing an organic EL element of the present invention will be described.

As an example of the method of manufacturing an organic EL element of the present invention, a method of manufacturing an organic EL element composed of anode/hole injection layer/hole transport layer/light emission layer/hole blocking layer/electron transport layer/cathode buffer layer/cathode will be described. A specific method of manufacturing an organic EL element will be described in Example in detail.

A monomer (organic compound having a reactive substituent) having an impurity content of 1000 ppm or less, concerning an organic electroluminescent element material (organic EL element material) of the present invention, is usable to form any one of a hole injection layer, a hole transport layer, a light emission layer, a hole blocking layer, an election transport layer and a cathode buffer layer described above, if desired.

First, a thin film made of a desired electrode material such as an anode material, for example, is formed on a substrate via evaporation or sputtering so as to give a film thickness of not more than 1 μm, but preferably 10-200 nm to prepare an anode. Next, a thin layer containing an organic compound as an element material constituting a hole injection layer, a hole transport layer, a light emission layer, a hole blocking layer or an electron transport layer is formed thereon.

Examples of the method of forming a thin film containing the organic compound (referred to also as an organic compound layer or an organic layer) include a spin coating method, a cast method, an inlet method, a vacuum evaporation method and a printing method, but a vacuum evaporation method or a spin coating method is specifically preferable in view of easy preparation of a homogeneous layer and reduced generation of pinholes.

Further, a different film formation method may be separately applied to each layer. When the evaporation method is applied for film formation, the evaporation conditions depend on kinds of utilized compounds, but in general, preferably selected are a boat heating temperature of 50-450° C., a vacuum degree of $10^{-6}$-$10^{-2}$ Pa, a deposition rate of 0.01-50 nm/sec, a substrate temperature of −50-300° C. and a film thickness of 0.1-5 μm.

After forming these layers, a 1 μm or less thick thin film made of a cathode material is formed thereon via evaporation or sputtering so as to preferably give a film thickness of 50-200 nm to obtain a desired organic EL element via formation of a cathode.

This organic EL element is preferably prepared in one time of evacuation for all steps of from a hole injection layer to a cathode, but a different film formation method may also be allowed to be used after removing the sample in the preparation on the way. In this case, the operation is preferably conducted in dry inert gas atmosphere.

Constituent Layer of Organic EL Element

As an element prepared by a method of manufacturing an organic thin film element of the present invention, provided is an organic electroluminescent element (organic EL element) as an example.

The constituent layer of an organic element of the present invention (referred to also as an organic layer or an organic compound layer), and an inorganic layer (referred to also as an inorganic compound layer) will be described. In the present invention, preferred examples of layer configuration of the organic EL element of the present invention will be specifically shown below, but the present invention is not limited thereto.

(i) anode/light emission layer/election transport layer/cathode (ii) anode/hole transport layer/light emission layer/electron transport layer/cathode (iii) anode/hole transport layer/light emission layer/hole blocking layer/electron transport layer/cathode (iv) anode/hole transport layer/light emission layer/hole blocking layer/electron transport layer/cathode buffer layer/cathode (v) anode/anode buffer layer/hole transport layer/light emission layer/hole blocking layer/electron transport layer/cathode buffer layer/cathode In the organic EL element of the present invention, a blue emission layer preferably has an emission maximum wavelength of 430-480 nm, a green emission layer preferably has an emission maximum wavelength of 510-550 nm, and a red emission layer preferably has an emission maximum wavelength of 600-640 nm, and a display employing these layers is preferred. At least these three layers may be laminated in order to prepare a white emission layer. A non-light emission layer may be provided as an intermediate layer between these emission layers. It is preferred that the organic EL element of the invention is a white emission layer or an illuminating device employing the same.

Each layer constituting the organic EL element of the present invention will be described.

Light Emission Layer

The light emission layer in the present invention is a layer what electrons and holes, injected from electrodes, an electron transport layer or a hole transport layer, are recombined to emit light. The portions where light emits may be in the light emission layer or at the interface between the light emission layer and the layer adjacent thereto.

The total thickness of the light emission layer is not specifically limited. In view of improving layer uniformity and stability of emission color against driving electric current without requiring unnecessary high voltage on light emission, the above thickness is adjusted to be in the range of preferably from 2 nm to 5 μm, more preferably from 2 nm to 200 nm, and still more preferably from 10 nm to 20 nm.

Employing an emission dopant or a host compound inch described later, the light emission layer is formed according to a known thin layer formation method such as a vacuum evaporation method, a spin coating method, a cast method, an LB method or an inkjet method.

The light emission layer of the organic EL element of the present invention preferably contains a host compound and at least one kind of an emission dopant (referred to also as phosphorescence dopant or a phosphorescence emission dopant) and a fluorescence dopant.

{Host Compound (Referred to Also as Emission Host)}

The host compound used in the present invention will be described below.

Herein, the host compound in the present invention is defined as a compound which is contained in the light emission layer in an amount of 20% by weight or more and which has a phosphorescence quantum yield at room temperature (25° C.) of less than 0.1. The phosphorescence quantum yield of the host compound is preferably less than 0.01. The content of the host compound in the light emission layer is preferably 20% by weight or more.

As a host compound, a commonly known host compound may be used singly, or in combination with plural kinds. It is possible to control the transfer of charges by making use of a plurality of host compounds, resulting in high efficiency of an organic EL element. In addition, it is possible to mix different emission lights by making use of a plurality of the aftermentioned emission dopants. Any mission color can be appropriately obtained thereby.

The structure of the emission host in the present invention is not specifically limited, but typical examples thereof include carbazole derivatives, triarylamine derivatives, aromatic borane derivatives, nitrogen-containing heterocyclic compounds, thiophene derivatives, furan derivatives, those having a moiety such as an oligoarylene compound, carboline derivatives, and derivatives each having a ring structure in which at least one of the carbon atoms of the hydrocarbon ring constituting a carboline ring of the foregoing carboline derivatives is replaced by a nitrogen atom.

Of these, preferable usable are carbazole derivatives, carboline derivatives, and derivatives each having a ring structure in which at least one of the carbon atoms of the hydrocarbon ring constituting a carboline ring of the foregoing carboline derivatives is replaced by a nitrogen atom.

Specific examples are shown below, but the present invention is not limited thereto. It is preferable that these compounds are also used as the hole blocking material.

H1

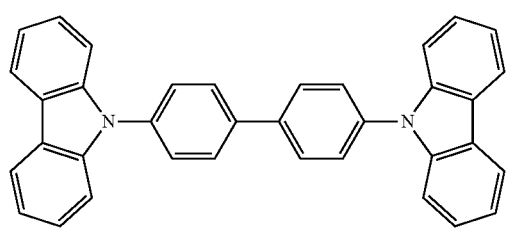

H2

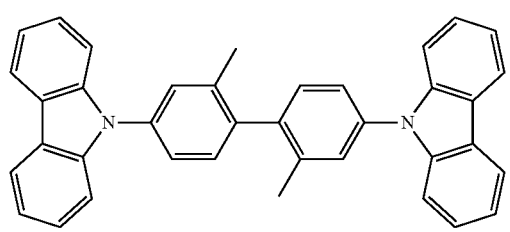

H3

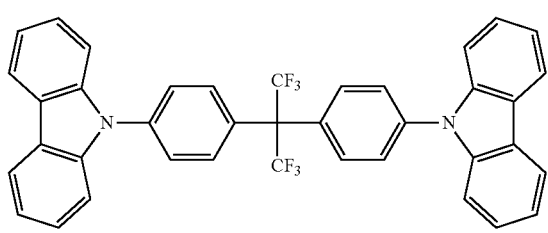

H4

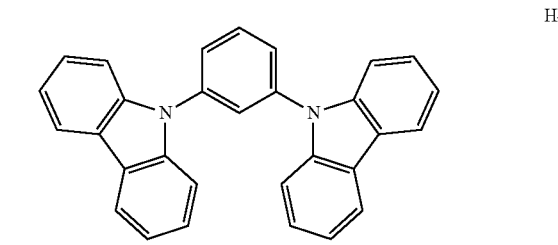

H5

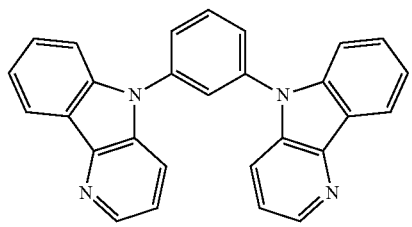

H6

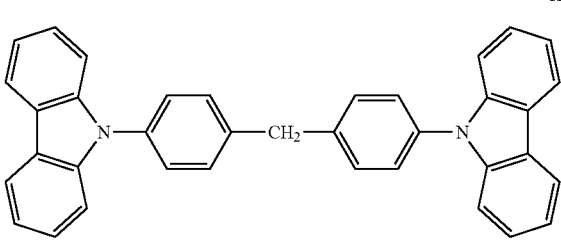

H7

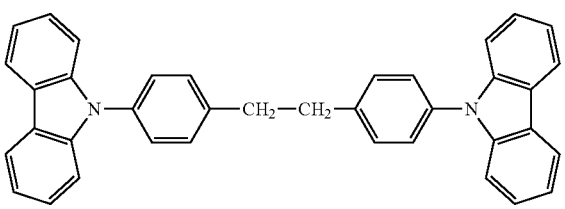

H-8

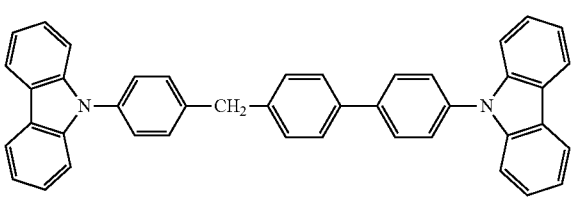

H-9

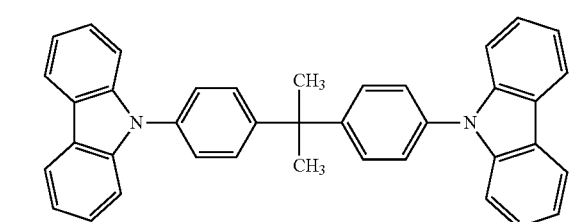

H-10

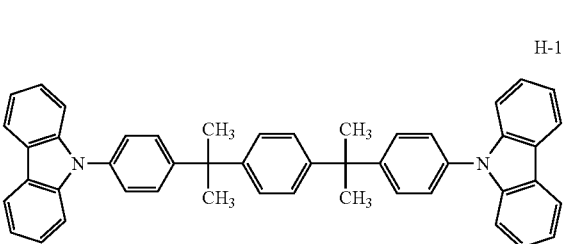

H-11
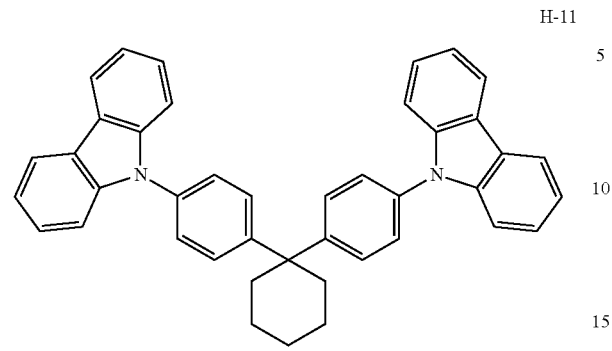
H-12
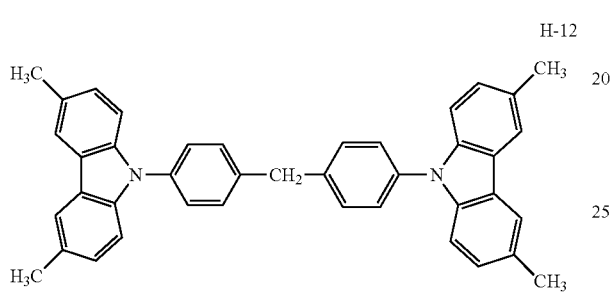
H-13
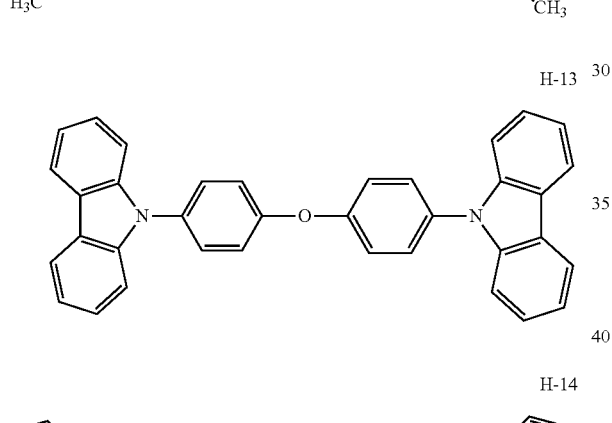
H-14
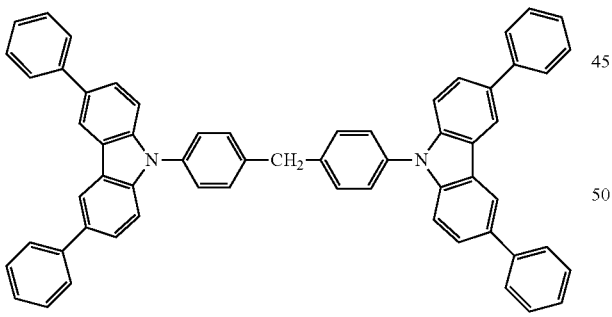
H-15
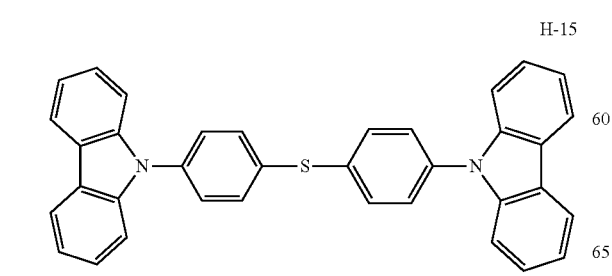
H-16
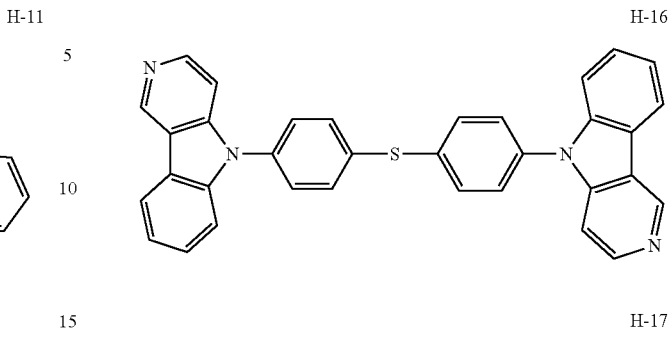
H-17
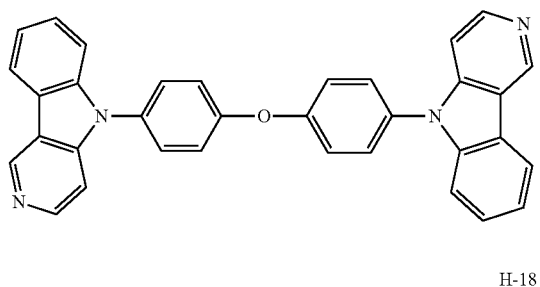
H-18
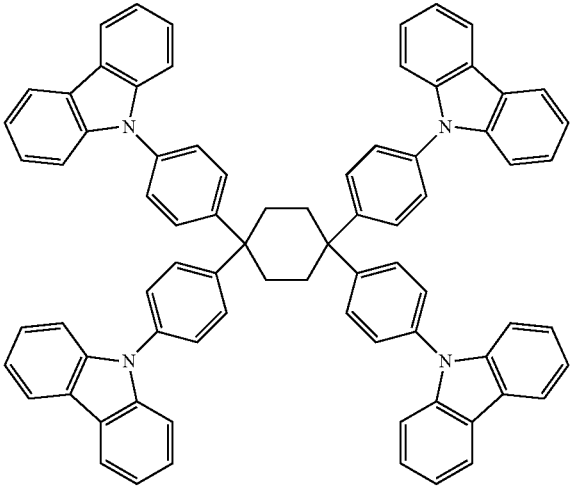
H-19
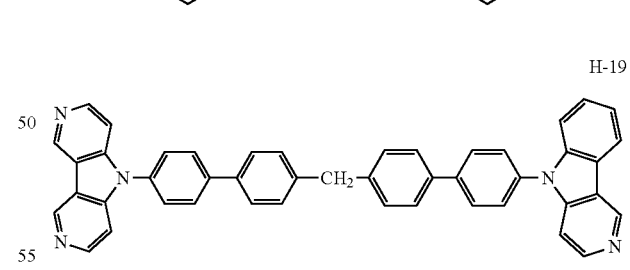
H-20
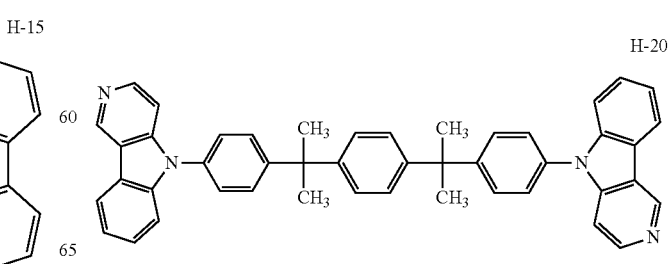

-continued

H-21
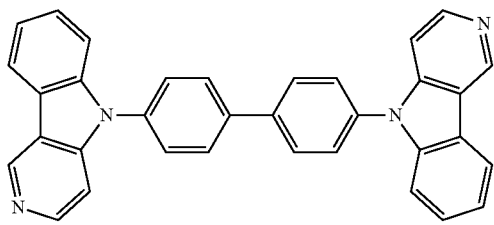

H-22
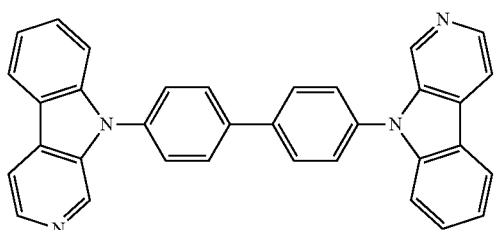

H-23
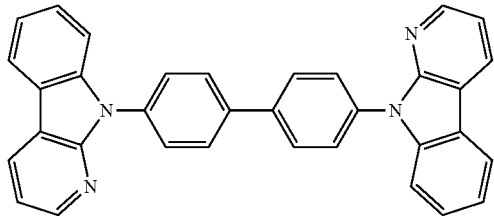

H-24
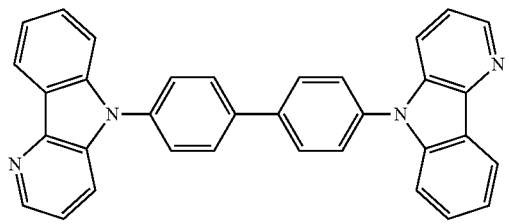

H-25
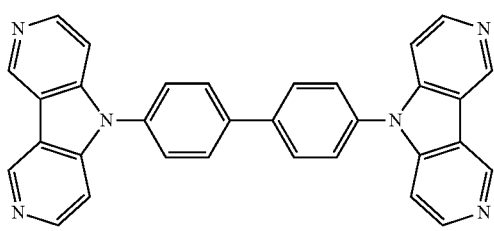

H-26
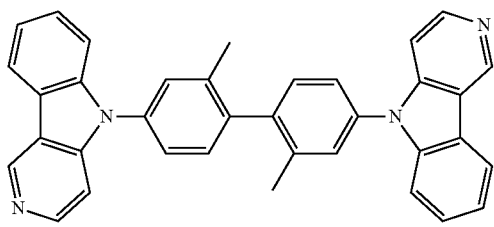

-continued

H-27

H-28

H-29

H-30

A commonly known host compound which may be used in combination is preferably a compound having hole transporting ability and election transporting ability, as well as preventing longer light emission wavelength and having a high Tg (a glass transition temperature).

As specific examples of the commonly known host compound, compounds described in the following documents are cited.

For example, Japanese Patent O.P.I. Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

(Emission Dopant)

The emission dopant in the present invention will be described.

As the emission dopant in the present invention, a compound having a partial structure represented by the foregoing Formula (1) or a compound having a partial structure represented by the foregoing Formula (2) is preferably usable as a phosphorescence dopant.

Further, as the emission dopant in the present invention, commonly known fluorescence dopant (also referred to as a fluorescent compound) and phosphorescence dopant (also referred to as a phosphorescence emitter, a phosphorescent compound or a phosphorescence emission compound) are usable.

(Phosphorescence Dopant)

The phosphorescence dopant in the present invention will be described.

The phosphorescence dopant in the present invention is a compound which emits light from the excitation triplet, can emit phosphorescence at mom temperature (25° C.), and has a phosphorescent quantum yield at 25° C. of 0.01 or more. The phosphorescent quantum yield at 25° C. is preferably 0.1 or more.

The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The phosphorescence dopant in the present invention is a compound, in which the phosphorescent quantum yield measured employing any one of the solvents satisfies the above-described definition (at least 0.01).

The light emission of the phosphorescence dopant is divided into two types in principle, one is an energy transfer type in which recombination of a carrier occurs on the host to which the carver is transported to excite the host, the resulting energy is transferred to the phosphorescence dopant, and light is emitted from the phosphorescence dopant, and the other is a carrier trap type in which recombination of a carrier occurs on the phosphorescence dopant, a carrier trap material, and light is emitted from the phosphorescence dopant. However, in each type, it is desired that energy level of the phosphorescence dopant in excited state is lower than that of the host compound in excited state.

The phosphorescence dopant can be suitably selected from those commonly known, which are used in the light emission layer of an organic EL element.

The phosphorescence dopant in the present invention is preferably a complex compound containing a metal belonging to groups 8 to 10 of the periodic table, and is more preferably an iridium compound, an osmium compound, a platinum compound (a platinum complex) or a rare earth compound, and most preferably an iridium compound.

Specifically listed are compounds described in the following patent publication.

WO 00/70655, Japanese Patent O.P.I. Publication No. 2002-280178, Japanese Patent O.P.I. Publication No. 2001-181616, Japanese Patent O.P.I. Publication No. 2002-280179, Japanese Patent O.P.I. Publication No. 2001-181617, Japanese Patent O.P.I. Publication No. 2002-280180, Japanese Patent O.P.I. Publication No. 2001-247859, Japanese Patent O.P.I. Publication No. 2002-299060, Japanese Patent O.P.I. Publication No. 2001-313178, Japanese Patent O.P.I. Publication No. 2002-302671, Japanese Patent O.P.I. Publication No. 2001-345183, Japanese Patent O.P.I. Publication No. 2002-324679, WO 02/15645, Japanese Patent O.P.I. Publication No. 2002-332291, Japanese Patent O.P.I. Publication No. 2002-50484, Japanese Patent O.P.I. Publication No. 2002-322292, Japanese Patent O.P.I. Publication No. 2002-83684, Japanese Patent O.P.I. Publication No. 2002-540572, Japanese Patent O.P.I. Publication No. 2002-117978, Japanese Patent O.P.I. Publication No. 2002-338588, Japanese Patent O.P.I. Publication No. 2002-170684, Japanese Patent O.P.I. Publication No. 2002-352960, WO 01/93642, Japanese Patent O.P.I. Publication No. 2002-50483, Japanese Patent O.P.I. Publication No. 2002-100476, Japanese Patent O.P.I. Publication No. 2002-173674, Japanese Patent O.P.I. Publication No. 2002-359082, Japanese Patent O.P.I. Publication No. 2002-175884, Japanese Patent O.P.I. Publication No. 2002-363552, Japanese Patent O.P.I. Publication No. 2002-184582, Japanese Patent O.P.I. Publication No. 2003-7469, Japanese Patent O.P.I. Publication No. 2002-525808, Japanese Patent O.P.I. Publication No. 2003-7471, Japanese Patent O.P.I. Publication No. 2002-525833, Japanese Patent O.P.I. Publication No. 2003-31366, Japanese Patent O.P.I. Publication No. 2002-226495, Japanese Patent O.P.I. Publication No. 2002-234894, Japanese Patent O.P.I. Publication No. 2002-235076, Japanese Patent O.P.I. Publication No. 2002-241751, Japanese Patent O.P.I. Publication No. 2001-319779, Japanese Patent O.P.I. Publication No. 2001-319780, Japanese Patent O.P.I. Publication No. 2002-62824, Japanese Patent O.P.I. Publication No. 2002-100474, Japanese Patent O.P.I. Publication No. 2002-203679, Japanese Patent O.P.I. Publication No. 2002-343572, and Japanese Patent O.P.I. Publication No. 2002-203678.

Specific examples of compounds used as the commonly known phosphorescence dopant are shown below, but the present invention is not limited thereto. In addition, these compounds are possible to be synthesized by the method described in Inorg. Chem. Vol. 40, 1704-1711.

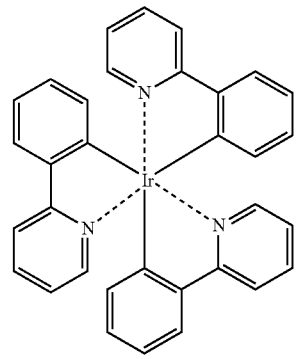

Ir-1

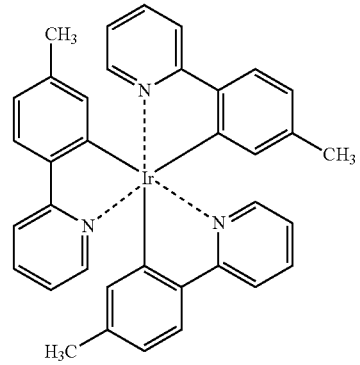

Ir-2

-continued
Ir-3
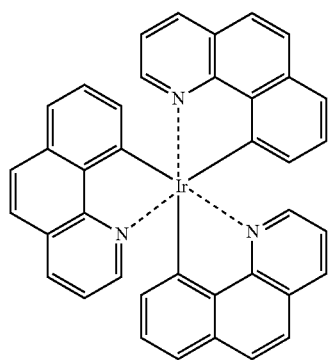
Ir-4
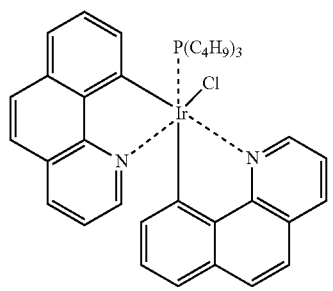
Ir-5
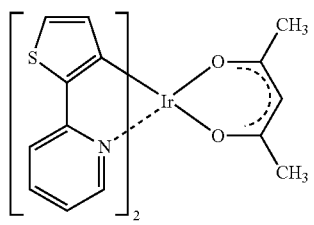
Ir-6
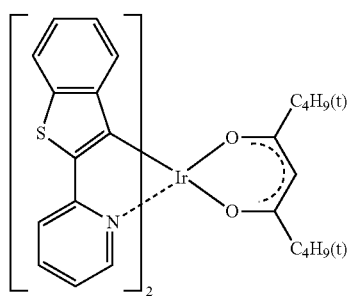
Ir-7
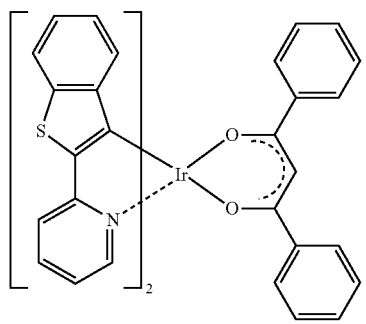
-continued
Ir-8
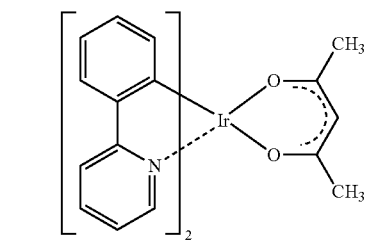
Ir-9
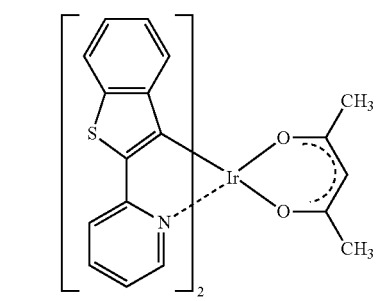
Ir-10
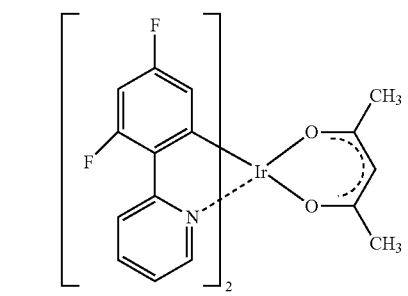
Ir-11
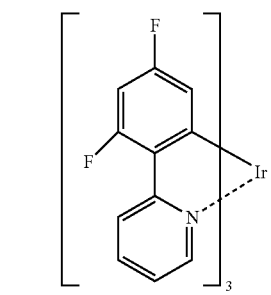
Ir-12
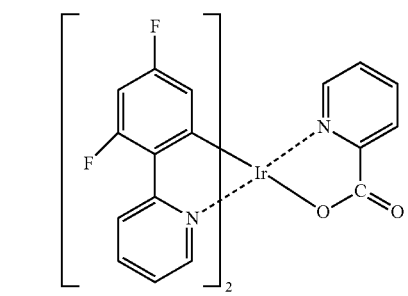

Ir-13
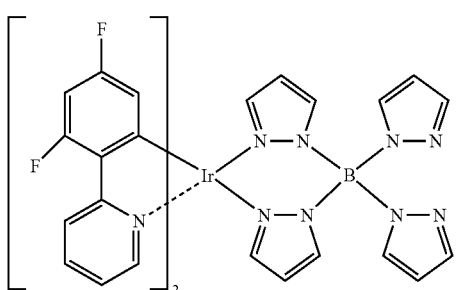
Ir-14
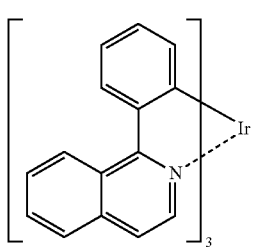
Ir-15
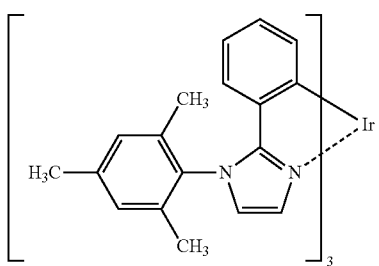
Ir-16
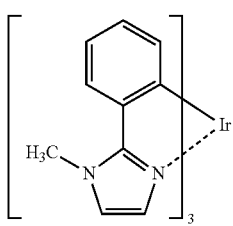
Pt-1
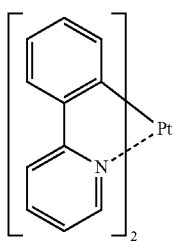
Pt-2
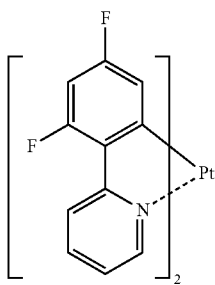
Pt-3
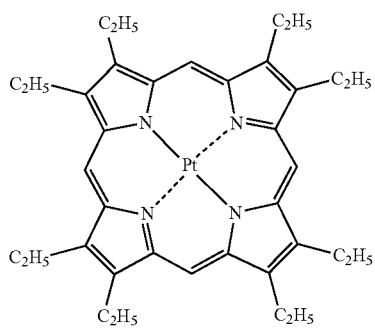
A-1
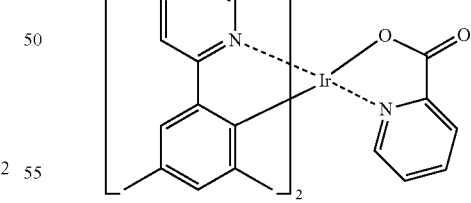
D-1
D-2
D-3
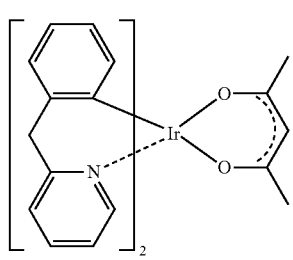

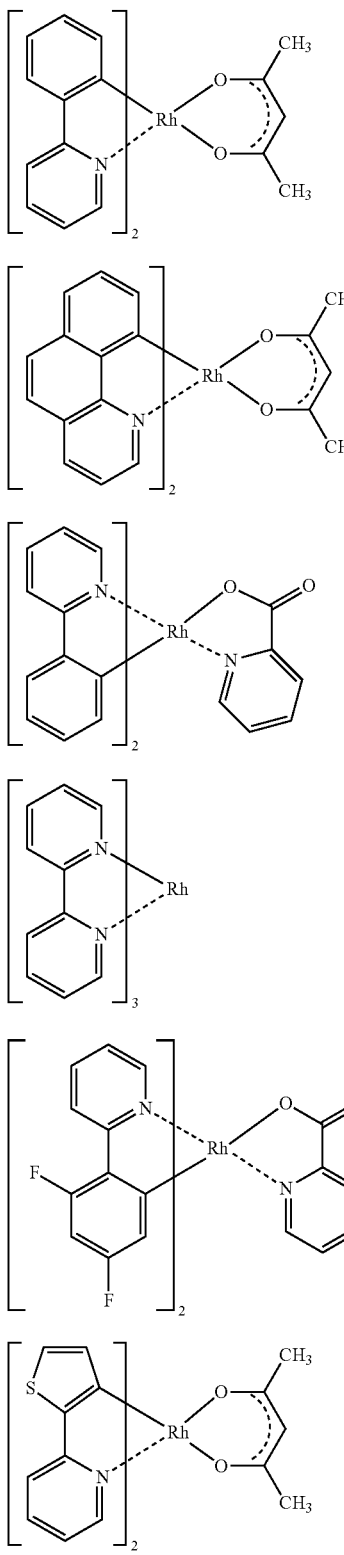

{Fluorescence Dopant (Referred to Also as a Fluorescent Compound)}

Examples of the fluorescence dopant (fluorescent compound) include a coumarin based dye, a pyrane based dye, a cyanine based dye, a chloconium based dye, a squarylium based dye, an oxobenzanthracene based dye, a fluorescene based dye, a rhodamine based dye, a pyrylium based dye, a perylene based dye, a stilbene based dye, a polythiophene based dye, and rare earth complex based phosphor.

Next, an injection layer, a blocking layer, and an electron transport layer used in the constituent layer of the organic EL element of the present invention will be described.

Injection Layer: Electron Injection Layer and Hole Injection Layer

The injection layer is optionally provided, for example, an electron injection layer or a hole injection layer, and may be provided between the anode and the light emission layer or hole transport layer, and between the cathode and the light emission layer or electron transport layer as described above.

The injection layer herein means a layer provided between the electrode and an organic layer in order to reduce the driving voltage or to improve of light emission efficiency, which is detailed in "Electrode Material", Div. 2 Chapter 2, pp. 123-166 of "Organic EL element and its frontier of industrialization" (published by NTS Corporation, Nov. 30, 1998). As the injection layer, there are a hole injection layer (anode buffer layer) and an electron injection layer (cathode buffer layer).

The anode buffer layer (hole injection layer) is described in Japanese Patent O.P.I. Publication Nos. 9-45479, 9-260062, and 8-288069, and examples thereof include a phthalocyanine buffer layer represented by a copper phthalocyanine layer, an oxide buffer layer represented by a vanadium oxide layer, an amorphous carbon buffer layer, a polymer buffer layer employing a conductive polymer such as polyaniline (emeraldine) or polythiophene.

The cathode buffer layer (electron injection layer) is described in detail in Japanese Patent O.P.I. Publication Nos. 6-325871, 9-17574, and 10-74586, and examples thereof include a metal buffer layer represented by a strontium or aluminum layer, an alkali metal compound buffer layer represented by a lithium fluoride layer, an alkali earth metal compound buffer layer typified by a magnesium fluoride layer, and an oxide buffer layer typified by an aluminum oxide. The buffer layer (injection layer) is preferably very thin and has a thickness of preferably from 0.1 nm to 5 μm depending on kinds of the material used.

Blocking Layer Hole Blocking Layer and Electron Blocking Layer

The blocking layer is a layer provided if desired in addition to the fundamental constituent layer as described above, and is for example, a hole blocking layer as described in Japanese Patent O.P.I. Publication Nos. 11-204258, and 11-204359, and on page 237 of "Organic EL element and its frontier of industrialization" (published by NTS Corporation, Nov. 30, 1998).

The hole blocking layer is an electron transport layer in a broad sense, and is comprised of material having ability of transporting electrons but extremely poor ability of holes, which can increase recombination probability of electrons and holes by transporting electrons and blocking holes.

Further, the constitution of an electron transport layer described later can be used in the hole blocking layer in the present invention, if desired.

The hole blocking layer in the organic EL element of the present invention is preferably provided so as to be in contact with a light emission layer.

It is preferred that the hole blocking layer contains an azacarbazole derivative as the foregoing host compound.

Further, in the present invention, when there am a plurality of light emission layers which emit a plurality of different color lights, it is preferable that a light emission layer emitting light having emission maximum in the shortest wavelength of all the light emission layers is provided closest to the anode. In such a case, it is preferred that a hole blocking layer is additionally provided between the light emission layer emitting a light having emission maximum in the shortest wavelength and a light emission layer provided closest to the anode excluding the above light emission layer emitting a light having emission maximum in the shortest wavelength.

Further, it is preferred that at least 50% by weight of compounds, which are incorporated in the hole blocking layer arranged in the above location, have an ionization potential 0.3 eV higher than that of the host compound contained in the light emission layer emitting alight having emission maximum in the shortest wavelength.

Ionization potential is defined as energy required to transfer an electron in an HOMO (highest occupied molecular orbital) level to the vacuum level, and can be determined by the methods described below.

(1) The ionization potential can be determined via calculation by performing structural optimization employing Gaussian 98 (Gaussian 98, Revision A. 11.4, M J. Frisch, et al, Gaussian, Inc., Pittsburgh Pa., 2002), which is a software for molecular orbital calculation of Gaussian, Inc., and B3LYP/6-31G* as a key word, and the calculated value (being the value interns of eV unit) is rounded off at the second decimal place. Background in which the calculated value above is effective is that the calculated value obtained by the above method and experimental values exhibit high correlation.

(2) his also possible to obtain ionization potential via a direct measurement method employing a photoelectron spectroscopy. For example, it is possible to appropriately employ a low energy electron spectrometer "Model AC-1", produced by Riken Keiki Co., Ltd., or a method known as ultraviolet photoelectron spectroscopy.

On the other hand, the electron blocking layer is a hole transport layer in a broad sense, and is comprised of material having ability of transporting holes but extremely poor ability of electrons, which can increase recombination probability of electrons and holes by transporting holes and blocking electrons.

The constitution of the hole transport layer as described later can be used as that of the electron blocking layer. The thickness of the hole blocking layer or electron transport layer is preferably 3-100 nm, and more preferably 5-30 nm.

Hole Transport Layer

The hole transport layer is comprised of a hole transport material having ability of transporting holes, and a hole injection layer and an electron blocking layer are included in the hole transport layer in abroad sense. The hole transport layer may be provided as a single layer or plural layers.

The hole transport material has hole injecting ability, hole transporting ability or ability to form a barrier to electrons, and may be either an organic substance or an inorganic substance. Examples thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and a conductive oligomer, particularly a thiophene oligomer.

As the hole transport material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)-phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4-(di-p-tolylamino)styryl]stilbene, 4-N,N-diphenylamino(2-diphenylvinyl)benzene, 3-methoxy-4-N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used. As the hole injection material or the hole transport material, inorganic compounds such as p-type-Si and p-type-SiC are usable.

So-called p-type hole transport materials as disclosed in Japanese Patent O.P.I. Publication No. 11-251067 or described in the literature of J. Huang et al (Applied Physics Letters 80 (2002), p. 139) are also applicable. In the present invention, these materials are preferably used since an emitting element exhibiting a higher efficiency is obtained.

The hole transport layer can be formed by layering the hole transport material by a commonly known method such as a vacuum evaporation method, a spin coating method, a cast method, an inlet method, and an LB method. The thickness of the hole transport layer is not specifically limited, but is conventionally 5 nm-5 μm, and preferably 5-200 nm. The hole transport layer may be composed of a single layer structure comprising one kind or at least two kinds of the materials mentioned above.

A positive hole transport layer having a high p-type property doped with impurity can be utilized. Examples thereof include those described in Japanese Patent O.P.I. Publication Nos. 4-297076, 2000-196140 and 2001-102175, and J. Appl. Phys., 95, 5773 (2004).

It is preferable in the present invention to employ such a positive hole transport layer having a high p-type property, since an element with lower power consumption can be prepared.

Electron Transporting Layer

The electron transport layer comprises a material (electron transport material) having electron transporting ability, and in a broad sense refers to an electron injection layer or a hole blocking layer. The election transport layer can be provided as a single layer or plural layers.

An electron transport material (which serves also as a hole blocking material) used in a single election transport layer or in the election transport layer closest to the cathode of plural election transporting layers has a function of incorporating electrons injected from a cathode to a light emission layer, and can be selected from commonly known compounds. Examples thereof include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative.

Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the election transport material. A polymer in which the material mentioned above is introduced in the polymer side chain or a polymer having the material as the polymer main chain can also be used.

A metal complex of an 8-quinolynol derivative such as aluminum tris-(8-quinolynol) ($Alq_3$), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol) ($Znq_2$), and a metal complex formed by replacing the central metal of the foregoing complexes with another metal atom such as In, Mg Cu, Ca, Sn, Ga or Pb, can be used as the electron transport material.

Furthermore, a metal-free or metal-containing phthalocyanine, and a derivative thereof in which the molecular terminal is replaced by a substituent such as an alkyl group or a sulfonic acid group, are also preferably used as the electron transport material. The distyrylpyrazine derivative exemplified as a material for the light emission layer may preferably be employed as the electron transport material. An inorganic semiconductor such as n-type-Si and n-type-SiC may also be used as the electron transport material in the same manner as in the hole injection layer or in the hole transport layer.

The electron transport layer can be formed employing the above-described electron transport materials and a known method such as a vacuum evaporation method, a spin coating method, a cast method, a printing method including an inkjet method or an LB method. The thickness of the election transport layer is not specifically limited, but is conventionally 5 nm-5 µm, and preferably 5-200 nm. The election transport layer may be composed of a single layer comprising one kind or at least two kinds of the electron transport material.

An electron transport layer having a high n property doped with impurity can be utilized. Examples thereof include those described in Japanese Patent O.P.I. Publication Nos. 4-297076, 10-270172, 2000-196140, 2001-102175, and J. Appl Phys., 95, 5773 (2004).

It is preferred in the present invention that use of such an electron transport layer having a high n property can provide an element with lower power consumption.

Anode

For the anode of the organic EL element, a metal, an alloy, or a conductive compound each having a high working function (4 eV or more), and mixture thereof are preferably used as the electrode material. Specific examples of such an electrode material include a metal such as Au, and a transparent conductive material such as CuI, indium tin oxide (ITO), $SnO_2$ or ZnO.

A material such as IDIXO ($In_2O_3$—ZnO) capable of forming an amorphous and transparent conductive layer may be used. The anode may be prepared by forming a thin layer of the electrode material according to a evaporation or sputtering method, and by forming the layer into a desired pattern according to a photolithographic method. When precision of the pattern is not desired to be not so high (roughly 100 µm or more), the pattern may be formed via evaporation or sputtering of the electrode material through a mask having a desired form.

When a coatable material such as an organic conductive compound is used, a wet coating method such as a printing method or a coating method can be used. When light is emitted through the anode, transmittance of the anode is preferably 10% or more, and the sheet resistance of the anode is preferably several hundreds $\Omega/\square$ or less. The thickness of the layer is conventionally 10-1000 nm, and preferably 10-200 nm, depending on kinds of materials used.

Cathode

On the other hand, for the cathode, a metal (referred to also as an electron injecting metal), an alloy and a conductive compound each having a low working function (4 eV or less), and a mixture thereof is used as the electrode material.

Specific examples of such an electrode material include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare-earth metal.

Among them, a mixture of an election injecting metal and a metal higher in the working function than that of the electron injecting metal, such as a magnesium/silver mixture, a magnesium/aluminum mixture, a magnesium/indium mixture, an aluminum/aluminum oxide ($Al_2O_3$) mixture, a lithium/aluminum mixture, or aluminum is suitable in view of durability against electron injection and oxidation.

The cathode can be prepared forming a thin layer of such an electrode material by a method such as a deposition or sputtering method. The sheet resistance as the cathode is preferably several hundreds $\Omega/\square$ or less, and the thickness of the layer is conventionally 10 nm-5 µm, and preferably 50-200 nm.

It is preferred in increasing emission luminance that either the anode or the cathode of the organic EL element, through which light passes, is transparent or semi-transparent.

After a layer of the metal described above as a cathode is formed to give a thickness of 1-20 nm, the transparent conductive material as described in the anode is layered thereon, whereby a transparent or semi-transparent cathode can be prepared. Employing this cathode, an element can be manufactured in which both anode and cathode are transparent.

Supporting Substrate

The supporting substrate (referred to also as a base body, a substrate, a base material or a support) employed for the organic EL element of the present invention is not limited to specific kinds of materials such as glass and plastic, as long as it is transparent. When light is taken out from the side of a substrate, the substrate is preferably transparent. Preferable examples of the usable substrate include glass, quartz and a transparent resin film. Specifically preferred supporting substrate is a resin film capable of providing flexibility to the organic EL element.

Examples of materials for the resin film include polyesters such as polyethylene terephthalate (PET) and polyethylene naphthalate (PEN), polyethylene, polypropylene, cellophane, cellulose esters and their derivatives such as cellulose diacetate, cellulose triacetate, cellulose acetate butylate, cellulose acetate propionate (CAP), cellulose acetate phthalate (TAC), and cellulose nitrate, polyvinylidene chloride, polyvinylalcohol, polyethylenevinylalcohol, syndiotactic polystyrene, polycarbonate, norbornane resin, polymethylpentene, polyetherketone, polyimide, polyether sulfone (PES), polyphenylene sulfide, polysulfones, polyether imide, polyetherketone imide, polyimide, fluorine resin, nylon, polymethyl methacrylate, acyl or polyarylates, and cyclo-olefin resins such as ARTON (commercial name, manufactured by JSR Corp.) or APEL (commercial name, manufactured by Mitsui Chemicals Inc.).

On the surface of the resin film, an inorganic or organic cover film or a hybrid cover film comprising the both may be formed, and the cover film is preferably one with a barrier ability having a water vapor permeability of 0.01 (m²·24 h) or less (at 25±0.5° C. and at (90±2) % RH), measured by a method in accordance with JIS K 7129-1992, and is more preferably one with a high barrier ability having an oxygen permeability of $10^{-3}$ mL/(m²·24 hr MPa) or less as well as a water vapor permeability of $10^{-5}$ g/(m²·24 h) or less, measured by a method in accordance with JIS K 7126-1987.

Any materials capable of preventing penetration substances such as moisture and oxygen causing degradation of the element are usable for forming the barrier film, and for example, silicon oxide, silicon dioxide and silicon nitride are usable. It is more preferred that the barrier film has a multi-layered structure composed of a layer of the inorganic material and a layer of an organic material for improving fragility of the film. It is preferred that the both layers are alternatively laminated several times though there is no limitation as to the lamination order of the inorganic layer and the organic layer.

The method to form the barrier film is not specifically limited, and for example, a vacuum evaporation method, a sputtering method, a reaction sputtering method, a molecular beam epitaxy method, a cluster ion beam method, an ion plating method, a plasma polymerization method, an atmospheric pressure plasma polymerization method, a plasma CVD method, a laser CVD method, a heat CVD method and a coating method are applicable, and the atmospheric pressure plasma polymerization method as described in Japanese Patent O.P.I. Publication No. 2004-68143 is specifically preferable.

As the opaque supporting substrate, for example, a metal plate such as an aluminum plate and a stainless steel plate, a film or an opaque resin substrate and a ceramic substrate are cited.

The taking-out efficiency of light emission of an organic EL element of the present invention at room temperature is preferably 1% or more, and more preferably 5% or more.

Herein, taking-out quantum yield (%) is as follows. Taking-out quantum yield (%)=(the number of photons emitted to the exterior of the organic electroluminescent element× 100)/(the number of electrons supplied to the organic electroluminescent element)

A hue-improving filter such as a color filter may be used in combination or a color conversion filter which can convert from emission light color from an organic EL element to multi-color employing a phosphor may be used in combination. In cases where the color conversion filter, the λmax of light emitted from the organic EL element is preferably 480 nm or less.

Sealing

As the sealing means used in the peseta invention, there is a method in which adhesion of a sealing member to an electrode and a supporting substrate is carried out employing an adhesive agent.

The sealing member is formed so as to cover the displaying region of an organic EL element and may have a flat plate shape or a concave plate shape, and transparency and an electrical insulation property thereof are not specifically limited.

Specific examples of the sealing member include a glass plate, a polymer plate, a polymer film, a metal plate and a metal film. As the glass plate, a plate of soda-lime glass, barium strontium-containing glass, lead glass, aluminosilicate glass, boron silicate glass, barium boron silicate glass or quartz is usable.

As the polymer plate, a plate of polycarbonate, acryl resin, polyethylene terephthalate, polyether sulfide or polysulfone is usable. As the metal plate, a plate composed of one or more kinds of metals selected from the group consisting of stainless steel, iron, copper, aluminum, magnesium, nickel, zinc, chromium, titanium, molybdenum, silicon, germanium and tantalum, and alloys thereof is provided.

In the present invention, the polymer film and the metal film are preferably used since the element formed from a thinner film can be prepared.

The polymer film is preferably one having an oxygen permeability of $1×10^{-3}$ in L/(m²·24 hr·MPa) or less, measured by a method in accordance with JIS K 7126-1987, and a water vapor permeability {at 25±0.5° C. and at (90±2) % RH} of $1×10^3$ g/(m²·24 h) or less, measured by a method in accordance with JIS K 7129-1992.

For processing the scaling material in the form of the concave, a sandblast treatment and a chemical etching treatment are used.

As the adhesive agent, there are mentioned a photo-curable or thermo-curable adhesive agent containing a reactive vinyl group such as an acrylic acid based oligomer or a methacrylic acid based oligomer, and a moisture curable adhesive agent such as 2-cyanoacrylate. Examples of the adhesive agent include an epoxy based thermally and chemically (two liquid type) curable adhesive agents, a hot-melt type polyamide, polyester or polyolefin adhesive agents, and a cationic curable type UV-curable epoxy adhesive.

The organic EL element is degraded by a heat treatment in some cases, and therefore, an adhesive agent capable of being cured within the temperature range of from room temperature to 80° C. is preferred. A drying agent may be dispersed in the adhesive agent. Coating of the adhesive agent onto the adhering portion may be performed by a dispenser available on the market or by printing such as screen printing.

It is preferred that a layer made of an inorganic or organic material is formed as a sealing layer on an electrode placed on the side hieing a supporting substrate an organic layer provided between the substrate and the electrode, so as to cover the electrode and the organic layer and contact with the substrate. In such a case, a material to form the sealing layer may be a material having a function to inhibit permeation substances such as water and oxygen causing degradation of the element, and for example, silicon oxide, silicon dioxide and silicon nitride are usable.

The sealing layer preferably has a multi-layered structure composed of a layer made of an inorganic material and a layer made of an organic material to improve fragility of the layer. The method of forming the layer is not specifically limited, and for example, a vacuum evaporation method, a sputtering method, a reaction sputtering method, a molecular beam epitaxy method, a cluster-ion beam method, an ion plating method, a plasma polymerization method, an atmospheric pressure plasma polymerization method, a plasma CVD method, a laser CVD method, a heat CVD method and a coating method are applicable.

In the spacing between the sealing layer and the displaying portion of the organic EL element, an inactive gas such as nitrogen or argon or an inactive liquid such as fluorinated hydrocarbon or silicone oil is preferably injected in the form of gas or liquid phase. It is also possible that vacuum is provided in the spacing. A hygroscopic compound can also be enclosed inside.

Examples of the hygroscopic compound include metal oxide such as sodium oxide, potassium oxide, calcium oxide, barium oxide, magnesium oxide or aluminum oxide; sulfate such as sodium sulfate, calcium sulfate, magnesium sulfate or cobalt sulfate; metal halide such as calcium chloride, magnesium chloride, cesium fluoride, tantalum fluoride, cerium bromide, magnesium bromide, barium iodide or magnesium iodide; and perchlorate such as barium perchlorate or magnesium perchlorate. Anhydride of the sulfate, halide and perchlorate is preferably usable.

Protective Layer and Protective Plat

A protective layer or a protective plate may be provided on the foregoing sealing layer formed on the side facing the substrate though the organic layer or outside the sealing layer in order to raise mechanical strength of the element. Specifically when sealing is carried out by the sealing layer as described above, such a protective layer or plate is preferably provided, since strength of the element is not so high. As materials for the protective layer or plate, the same glass pinto, polymer plate, polymer film, metal plate and metal film as those described above to be used for sealing are usable. The polymer film is preferably used from the viewpoint of light weight and a thin layer formation property.

Taking-Out of Light

It is generally said that, in the organic EL element, light is emitted in a layer whose refractive index (the refractive index is about 1.7-2.1) is higher than that of air, and only 15 to 20% of the light emitted in the light emission layer can be taken out. This is because light which enters a boundary (a boundary between a transparent substrate and the atmosphere) at an angle θ larger than a critical angle is totally reflected and cannot be taken out from the element, or because light is totally reflected at a boundary between the transparent substrate and the transparent electrode or between the transparent substrate and the light emission layer, so that the light exits from the side of the element through the transparent electrode or the light emission layer.

As methods to improve the light taking-out efficiency, there are a method to form concavity and convexity on the surface of the transparent substrate to prevent total internal reflection at a boundary between the transparent substrate and atmospheric air (see U.S. Pat. No. 4,774,435); a method to provide light focusing properties to the substrate to improve the efficiency (see Japanese Patent O.P.I. Publication No. 63-314795); a method to form a reflection surface on the side of the element (see Japanese Patent O.P.I. Publication No. 1-220394); a method to form a flat layer having an intermediate refractive index between the substrate and the light emission layer to form an anti-reflection layer (see Japanese Patent O.P.I. Publication No. 62-172691); a method to form a flat layer having a low refractive index between the substrate and the light emission layer (see Japanese Patent O.P.I. Publication No. 2001-202827); and a method to form a diffraction lattice at a boundary between any two of the substrate, the transparent electrode and the light emission layer (including a boundary between the substrate and atmospheric air) (see Japanese Patent O.P.I. Publication No. 11-283751).

In the present invention, these methods can be used in combination with the organic electroluminescent element of the present invention. Also, a method of forming a flat layer having a lower refractive index than that of the substrate between the substrate and the light emission layer, or a method of forming a diffraction lattice at a boundary between any of the substrate, transparent electrode and light emission layer (including a boundary between the substrate and the atmosphere) can be preferably used.

In the present invention, an element exhibiting further higher luminance and durability can be obtained by using these methods in combination.

When a low refractive index medium with a thickness greater than light wavelength is formed between a transparent electrode and a transparent substrate, the taking-out efficiency of light, which comes out of the transparent electrode, increases, as the refractive index of the medium decreases.

As a low refractive index layer, aerogel, porous silica, magnesium fluoride and a fluorine-containing polymer are cited, for example. Since refractive index of the transparent substrate is conventionally 1.5-1.7, the refractive index of the low refractive index layer is preferably 1.5 or less and more preferably 1.35 or less.

The thickness of a low refractive index medium is preferably twice or more of the wavelength of light in the medium, because when thickness of the low refractive index medium is such that the electromagnetic wave exuding as an evanescent wave enters the transparent substrate, the effect of the low refractive index layer is reduced.

A method to provide a diffraction lattice at a boundary where the total internal reflection occurs or in some of the media has a feature that the effect of enhancing the light extraction efficiency increases.

The intension of this method is to provide a diffraction lattice at a boundary between any of the layers or in any of the mediums (in the transparent substrate or in the transparent electrode) and extract light which cannot exit due to total reflection occurring at a boundary between the layers among lights emitted in the light emission layer, which uses the property of the diffraction lattice that can change the direction of light to a specific direction different from the direction of reflection due to so-called Bragg diffraction such as primary diffraction or secondary diffraction.

It is preferred that the diffraction lattice to be provided has a two-dimensional periodic refractive index. This is because, since light generated in the light emission layer is emitted randomly in all the directions, only the light proceeding in a specific direction can be diffracted when a general one-dimensional diffraction lattice having a periodic refractive index distribution only in a specific direction is used, which does not greatly increase the light taking-out efficiency.

However, a refractive index distribution is two-dimensionally distributed, whereby the light proceeding in all the directions can be diffracted, and then the light taking-out efficiency is increased.

The position where the diffraction lattice is introduced, as previously described, is any of boundaries each between layers or in a medium (in the transparent substrate or in the transparent electrode), but it is preferably provided in the vicinity of the organic light emission layer where the light is emitted.

In this case, the period of the diffraction lattice is preferably about ½ to 3 times the wavelength of light in the medium.

The array of the diffraction lattice is preferably two-dimensionally repeated as in the shape of a square lattice, a triangular lattice, or a honeycomb lattice.

Light Collection Sheet

In the organic EL element of the present invention, luminance in a specified direction can be increased, for example, by providing a structure in the form of a micro-lens array on the light taking-out side surface of the substrate or in combination with a so-called light collection sheet, whereby light is focused inn specific direction, for example, in the front direction to the light emitting plane of the element.

As an example of a micro-lens array, there is one in which quadrangular pyramids having a side of 30 μm and having a vertex angle of 90° are two-dimensionally arranged on the light taking-out side surface of the substrate. The side of the quadrangular pyramids is preferably 10-100 μm. When the length of the side is shorter than the above range, the light is colored via producing of the effect of diffraction, while when it is longer than the above range, it becomes unfavorably thick.

As the light collection sheet, one practically applied for an LED backlight of a liquid crystal display is applicable. Usable examples of such a sheet include a brightness enhancing film (BEF) produced by SUMITOMO 3M Inc.

As shape of a prism sheet, there may be included one in which a triangle-shaped strip having a vertex angle of 90° and a pitch of 50 μm provided on a substrate, one having round apexes, one having a randomly changed pitch or other ones.

In order to control an emission angle of light emitted from the light emitting element, a light diffusion plate or film may be used in combination with the light collection sheet. For example, a diffusion film (Light-Up, produced by KIMOTO Co., Ltd.) is usable.

Use of Organic Thin Film Element

The organic thin film element of the present invention can be used as an organic EL element, a display device, a display, or various light emission sources. Examples of the light emission sources include an illuminating device (a home lamp or a room lamp in a car), a backlight for a watch or a liquid crystal, a light source for boarding advertisement, a signal device, a light source for a photo memory medium, a light source for an electrophotographic copier, a light source for an optical communication instrument, and a light source for an optical sensor, but the present invention is not limited thereto. Specifically, it is effectively usable as a backlight for a liquid crystal or a light source for illumination.

Further, in preparation of an organic thin film element of the present invention, patterning may be carried out with a metal mask or by an inlet printing method, if desired. The patterning may be carried out only in electrodes, in both electrodes and light emission layers, or in all the layers of the element. Further, the element can also be prepared according to a commonly known method.

Figure 4:
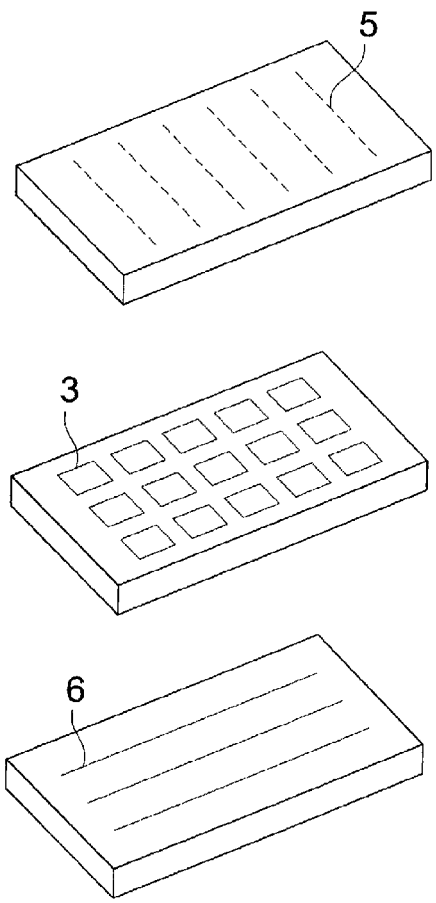
FIG. 4 is a schematic diagram showing a passive matrix system full color display device.
Figure 5:
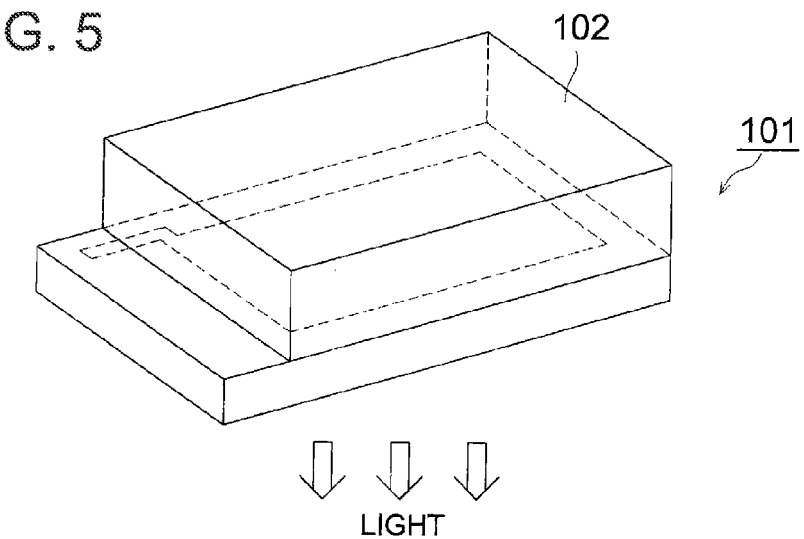
FIG. 5 is an appearance diagram showing an illuminating device.
Figure 6:
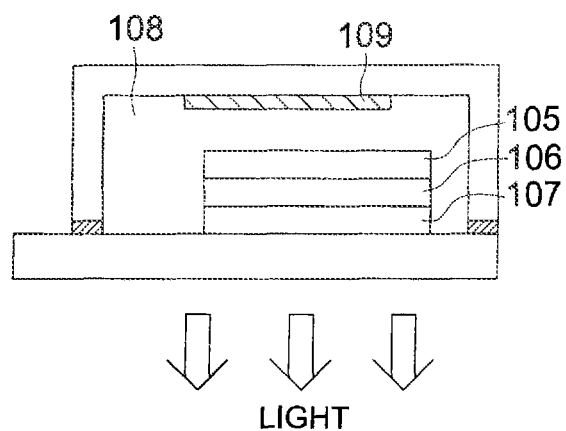
FIG. 6 is a schematic diagram showing an illuminating device.

Color of light emitted from the organic EL element of the present invention or from the compounds in the present invention is specified with color obtained when measurements determined by a spectral radiance luminance meter CS-1000 (produced by Konica Minolta Sensing Co., Ltd.) are applied to the CIE chromaticity coordinates in FIG. 4.16 on page 108 of "Shinpen Shikisai Kagaku Handbook (edited by The Color Science Association of Japan, University of Tokyo Press, 1985).

When the organic EL element of the present invention is a white light element, "white" means that when front luminance of a 2° viewing angle is determined via the above method, chromaticity in the CIE 1931 Chromaticity System at 1,000 Cd/m$^2$ is in the range of X=0.33±0.07 and Y=0.33±0.1.

Illuminating Device

An illuminating device of the present invention will be described. The illuminating device of the present invention possesses the above-described organic EL element.

The organic EL element of the present invention may be employed as one having a resonator structure. As intended use of the aforesaid organic EL element having such a resonator structure include, provided are a light source for an optical memory medium, alight source for an electrophotographic copier, a light source for an optical communication processor, and a light source for an optical sensor, but the present invention is not limited thereto. Further, laser oscillation may also be applied for the above-described intended use.

Further, the organic EL element of the present invention may also be employed as a type of lamp for lighting or an exposure light source, a projection device to project images, and a display device (display) to directly visualize still images and moving images. A drive system employed as a display for reproduction of moving images may be allowed to be a simple matrix (passive matrix) system, and also allowed to be an active matrix system. Alternatively, it is possible to prepare a full-color display device by using at least two types of the organic EL elements of the present invention having different light emitting colors, One example of a display device possessing an organic EL element of the present invention, will be described referring to figures.

FIG. 1 is a schematic diagram showing one example of a display device possessing an organic EL element. It is a schematic diagram of a display such as a cellular phone display, for example, to display image information via light emission of an organic EL element.

Display 1 is composed of display section A having a plurality of pixels and control section B to conduct image scanning of display section A, based on image information.

Control section B is electrically connected to display section A; scanning signals and image data signals are transmitted to each of the plural pixels based on the image information from the exterior, and pixels of each scanning line sequentially emit light in response to image data signals through scanning signals to display image information on display section A via scanning of images.

Figure 2:
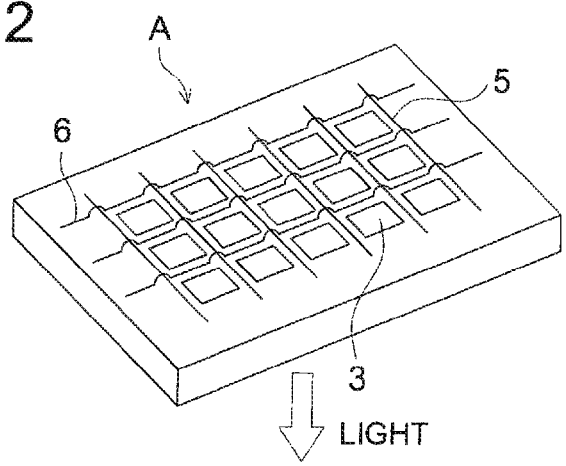
FIG. 2 is a schematic diagram showing display section A.

FIG. 2 is a schematic diagram of display section A.

Display section A possesses a substrate and provided thereon, a wiring section possessing plural scanning lines 5 and data lines 6, and plural pixels 3. The major members of display section A will be described below.

In the figure, shown is the case where light emitted by pixel 3 is taken out in the white arrow direction (in the lower direction).

Each of scanning lines 5 and plural data lines 6 in a wiring section is made of a conductive material and scanning lines 5;

scanning lines 5 and plural data lines 6 are orthogonal in the form of a lattice, and are connected to pixel 3 (not shown in the figure in detail).

When a scanning signal is applied from scanning line 5, pixel 9 receives an image data signal from data line 6 to produce luminescence in response to the receiving image data.

It is possible to display full color by appropriately placing pixels in the red region, pixels in the green region and pixels in the blue region in parallel for light emission colors on the same substrate.

Next, the light emission process will be described.

Figure 3:
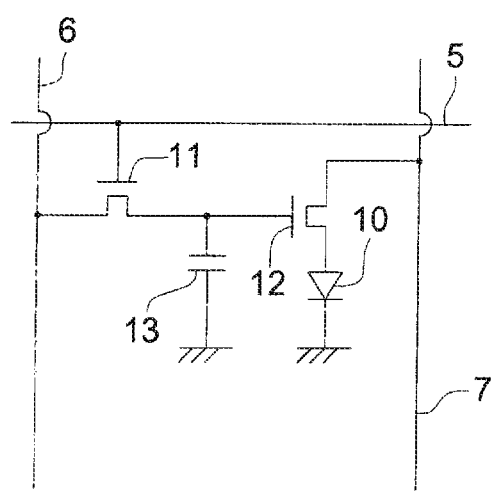
FIG. 3 is a schematic diagram showing a pixel.

FIG. 3 shows a schematic diagram of a pixel.

The pixel possesses organic EL element 10, switching transistor 11, drive transistor 12, and condenser 13. As organic EL element 10, red, green and blue light emitting organic EL elements are employed for plural pixels, and these are placed in parallel on the same substrate to display full color.

In FIG. 3, image data signals are applied to the drain of switching transistor 11 via data line 6 from control section B. Subsequently, when a scanning signal is applied to the gate of switching transistor 11 via scanning line 5 from control section B, the drive of switching transistor 11 is activated, and an image data signal applied to the drain is transmitted to the gate of condenser 13 and drive transistor 12.

Through transmission of the image data signal, condenser 13 is charged depending on the electrical potential of the image data signal, and simultaneously, the drive of drive transistor 12 is activated. In drive transistor 12, the chain is connected to power supply line 7; the source is connected to the electrode of organic EL element 10; and electric current is supplied to organic EL element 10 from power supply line 7, depending on the electric potential of the image data signal applied to the gate.

When a scanning signal is transferred to the following scanning line 5 via sequential scanning of control section B, the chive of switching transistor 11 is deactivated. However, since condenser 13 maintains the electrical potential of a charged image data signal even though the drive of switching transistor 11 is deactivated, the drive of drive transistor 12 is kept activated, and light emission of organic EL element 10 is continued until the following scanning signal is applied. When the following scanning signal is applied via sequential scanning, drive transistor 12 is driven depending on the electrical potential of the next image data signal synchronized with a scanning signal, whereby organic EL element 10 produces luminescence.

That is, as to light emission of organic EL element 10, switching transistor 11 and chive transistor 12 as the active element are provided with respect to organic EL element 10 for each of the plural pixels, and organic EL element 10 for each of plural pixels 3 produces luminescence. Such the light emitting method is called an active matrix system.

Herein, light emission of organic EL element 10 may be light emission exhibiting a plurality of gradations obtained via a multi-valued image data signal having a plurality of gradation potentials, or may be on-and-off of a prescribed light emitting amount obtained via a binary image data signal. Further, the electrical potential of condenser 13 may be continuously maintained until the next scanning signal is applied, or may be discharged immediately before the next scanning signal is applied.

In the present invention, in addition to the above-described active matrix system, may be allowed to be used is a light emission chive of a passive matrix system in which an organic EL element emits light, depending on the data signal, only when a scanning signal is scanned.

FIG. 4 is a schematic diagram of a display device of a passive matrix system. In FIG. 4, plural scanning lines 5 and plural image data lines 6 sandwiching pixel 3 and facing to each other are provided in the form of a lattice.

When the scanning signal of scanning lines 5 are applied via sequential scanning, pixels 3 connected to applied scanning lines 5 emit light in response to the image data signal.

In the case of a passive matrix system, pixels 3 have no active element, resulting in reduction of manufacturing cost.

Further, the organic EL material of the present invention can be applied to an organic EL element substantially emitting white light. A plurality of light emitting colors are simultaneously emitted from a plurality of light emitting materials to obtain white light emission via color mixture. A combination with a plurality of light emitting colors may be one including three light emission maximum wavelengths of the three primary colors of blue, green and red, or may be one including two light emission maximum wavelengths utilizing the complementary color relationship such as blue and yellow or bluish-green and orange.

Example

Next, the present invention will be described referring to Examples, but the present invention is not limited thereto. In addition, compounds used in Examples are shown below.

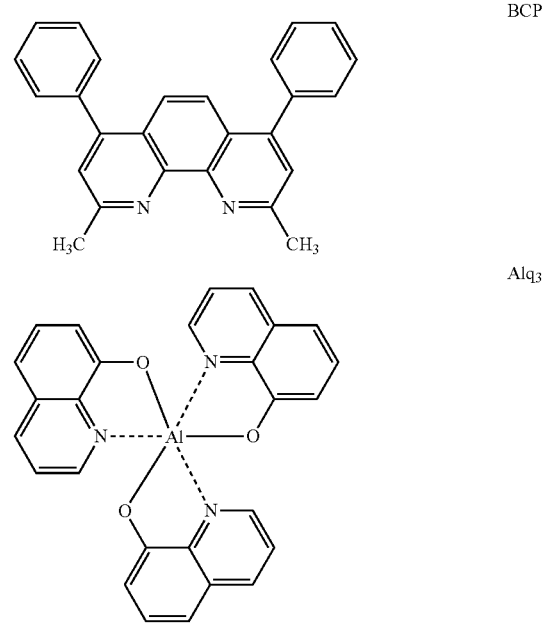

Example 1

Preparation of Organic EL Element

Preparation of Coating Solutions 1-1 to 1-8

Under nitrogen atmosphere, 600 mg of 1-2a prepared in the foregoing synthetic example and 30 mg of Ir-1 were dissolved in dehydrated dichlorethane, while stirring and exposed to UV rays employing a high pressure mercury lamp for 120 seconds to obtain coating solution 1-1.

Coating solutions 1-2 to 1-8 were prepared similarly to preparation of coating solution 1-1, except that compound 1-2a was replaced by compounds shown in Table 1.

It was possible to be confirmed that a polymer had been prepared from the monomer contained therein by analyzing a part of each of coating solutions 1-1 to 1-8 employing a commercially available LC-Mass.

Preparation of Organic EL Element 1-1

A substrate (NA45, produced by NH Techno Glass Corp.), prepared by forming a 100 nm thick ITO (indium tin oxide) film as an anode on a glass plate having a size of 100×100×1.1 mm, was subjected to patterning, and a transparent supporting substrate provided with this ITO transparent electrode was cleaned with isopropyl alcohol via ultrasonic waves, followed by being dried employing dry nitrogen gas and being cleaned for 5 minutes employing UV ozone.

This substrate was placed on a spin coater, and a solution prepared by diluting poly(3,4-ethylenedioxythiophene)-polystyrenesulfonate (PEDOT/PSS, produced by Bayer Co., BAYTRON P A1 4083) by 70% with pure water was coated by a spin coating method to form a film at 3,000 rpm for 30 seconds, followed by drying at 200° C. for one hour, resulting in formation of a hole transport layer having a film thickness of 30 nm.

After completing a drying treatment, a substrate was placed on the spin coater again, and coating solution 1-1 was spin-coated at 1000 rpm for 30 seconds, so as to give a film thickness of 40 mm, followed by drying in vacuum at 60° C. for one hour to obtain a light emission layer.

Next, this substrate was fixed on a substrate holder in a vacuum evaporator, and inside the vacuum evaporator, 200 mg of bathocuproine (BCP) were charged in a molybdenum resistance healing boat; 200 mg of $Alq_3$ were charged in another molybdenum resistance heating boat. After depressurizing the vacuum chamber to $4 \times 10^{-4}$ Pa, the foregoing heating boat in which BCP was charged was heated via electricity application to conduct evaporation on the foregoing light emission layer at a deposition rate of 0.1 nm/sec, and a hole blocking layer having a film thickness of 10 nm was further provided.

Subsequently, the foregoing healing boat in which $Alq_3$ was charged, was heated via electricity application, and evaporation was conducted on the foregoing hole blocking layer at a deposition rate of 0.1 nm/sec to further form an electron transport layer having a film thickness of 40 nm. In addition, the substrate temperature during evaporation was room temperature.

Subsequently, lithium fluoride and aluminum were deposited so as to give thicknesses of 0.5 nm and 110 nm, respectively to form a cathode. This, organic EL element 1-1 was prepared.

Preparation of Organic EL Elements 1-2 to 1-8

Organic EL elements 1-2 to 1-8 were prepared similarly to preparation of organic EL element 1-1, except that coating solution 1-1 was replaced by coating solutions 1-2 to 1-8, respectively.

Evaluation of Organic EL, Elements 1-1 to 1-8

The resulting organic EL elements 1-1 to 1-8 were evaluated as shown below.

Externally Taking-Out Quantum Efficiency

The externally taking-out quantum efficiency (%) of each of the resulting organic EL elements 1-1 to 1-8 during application of a constant current of 2.5 $mA/cm^2$ under dried nitrogen atmosphere was measured, and shown in Table 1. In addition, a spectrum radiation luminance meter CS-1000, manufactured by Konica Minolta Sensing, Inc., was employed for the measurements.

The measured results of the externally taking-out quantum efficiency shown in Table 1 are represented by the relative value when the measured value of organic EL element 1-1 is set to 100.

Light Emission Lifetime

Time necessary for reducing luminance to half of the luminance immediately after emission at the initial time (initial luminance) was measured when driving with a constant current of 2.5 $mA/cm^2$, and was designated as a measure of half-lifetime ($\tau^{0.5}$).

A spectrum radiation luminance meter CS-1000, manufactured by Konica Minolta Sensing, Inc., was employed for the measurements.

The measured results of the light emission lifetime shown in Table 1 are represented by the relative value when the measured value of organic EL element 1-1 is set to 100.

Obtained results are shown in Table 1.

TABLE 1

| Element | Host compound (Purity) | Externally taking-out quantum efficiency | Light emission lifetime | Reloads |
|---|---|---|---|---|
| 1-1 | 1-2a(99.30%) | 100 | 100 | Comparative example |
| 1-2 | 1-2b(98.02%) | 106 | 113 | Comparative example |
| 1-3 | 1-2c(99.53%) | 112 | 182 | Comparative example |
| 1-4 | 1-2d(99.92%) | 126 | 245 | Present invention |
| 1-5 | 1-2e(99.99%) | 132 | 388 | Present invention |
| 1-6 | 1-1(99.98%) | 122 | 353 | Present invention |
| 1-7 | 1-12(99.99%) | 142 | 398 | Present invention |
| 1-8 | 1-19(99.99%) | 138 | 402 | Present invention |

As is clear from Table 1, organic EL elements of the present invention exhibit longer light emission lifetime in comparison to organic EL elements in Comparative examples.

Example 2

Preparation of Organic EL Element (Preparation of Coating Solutions 2-1A to 2-3A)

The following coating solutions 2-1A to 2-3A were prepared employing the compound shown in Table 2.

Under nitrogen atmosphere, 600 mg of exemplified compound 4-1a (a purity content of 98.85% by weight) were dissolved in 60 mL of dehydrated xylene, and heated at 130° C. for 30 minutes to prepare coating solution 2-1A.

Subsequently, under nitrogen atmosphere, 600 mg of exemplified compound 1-21a (a purity content of 98.23% by weight) and 30 mg of exemplified compound 2-25a (a purity content of 99.31% by weight) were dissolved in 60 mL of dehydrated xylene, and heated at 130° C. for 30 minutes to prepare coating solution 2-2A.

Further, under nitrogen atmosphere, 600 mg of exemplified compound 3-14a (a purity content of 99.18% by weight) were dissolved in 60 mL of dehydrated xylene, and heated at 130° C. for 30 minutes to prepare coating solution 2-3A.

(Preparation of Coating Solutions 2-1B to 2-3B)

Coating solutions 2-1B to 2-3B were prepared similarly to preparation of coating solutions 2-1A to 2-3A, by utilizing materials shown in Table 2.

It was possible to be confirmed that a polymer had been prepared from the monomer contained therein by analyzing a part of each coating solution employing a commercially available LC-Mass.

Preparation of Organic EL Element 2-1

A substrate (NA45, produced by NH Techno Glass Corp.), prepared by forming a 100 nm thick ITO (indium tin oxide) film as an anode on a glass plate having a size of 100×100×1.1 mm, was subjected to patterning, and a transparent supporting substrate provided with this ITO transparent electrode was cleaned with isopropyl alcohol via ultrasonic waves, followed by being dried employing dry nitrogen gas and being cleaned for 5 minutes employing UV ozone.

This substrate was placed on a spin coater, and a solution prepared by diluting poly(3,4-ethylenedioxythiophene)-polystyrenesulfonate (PEDOT/PSS, produced by Bayer Co., BAYTRON P A1 4083) by 70% with pure water was coated by a spin coating method to form a film at 3,000 rpm for 30 seconds, followed by drying at 200° C. for one hour, resulting in formation of a hole injection layer having a film thickness of 30 nm.

After completing a drying treatment, a substrate was placed on the spin coater again, and coating solution 2-1A was spin-coated at 1000 rpm for 30 seconds to form a hole transport layer. Subsequently, coating solution 2-2A was spin-coated at 1000 rpm for 30 seconds to form a light emission layer, and further, coating solution 2-3A was spin-coated at 1000 rpm for 30 seconds to form an electron transport layer.

Next, this substrate was fixed on a substrate holder in a vacuum evaporator, and inside the vacuum evaporator, 200 mg of Alq$_3$ were charged in a molybdenum resistance heating boat.

After depressurizing the vacuum chamber to 4×10$^{-4}$ Pa, the foregoing heating boat in which Alq$_3$ was charged was heated via electricity application to conduct evaporation on the forgoing electron transport layer at a deposition rate of 0.1 nm/sec, and an electron injection layer having a film thickness of 40 nm was further provided. In addition the substrate temperature during evaporation was room temperature.

Subsequently, lithium fluoride and aluminum were deposited so as to give thicknesses of 0.5 nm and 110 nm, respectively to form a cathode. Thus, organic EL element 2-1 was prepared.

(Preparation of Organic EL Element 2-2)

Organic EL element 2-2 was prepared similarly to preparation of organic EL element 2-1A, by utilizing coating solutions 2-1B, 2-2B, and 2-3B.

When electricity was applied to these elements, light emission of blue color was obtained, whereby it was confirmed that these elements were usable as an organic EL display.

Evaluation of Organic EL Elements 2-1 and 2-2

Similarly to the evaluation of organic EL element 1-1 in Example 1, results shown in Table 2 were obtained. In addition, the measured results of the light emission lifetime shown in Table 2 are represented by the relative value when the measured value of organic EL element 2-1 is set to 100.

TABLE 2

| Element | Hole transport material Purity (%) | Light emitting material Purity (%) | Electron transport material Purity (%) | Light emission lifetime | Remarks |
|---|---|---|---|---|---|
| 2-1 | 4-1a (98.85%) | 1-21a(98.23%)/ 2-25a(99.31%) | 3-14a (99.18%) | 100 | Comparative example |
| 2-2 | 4-1b (99.99%) | 1-21b(99.99%)/ 2-25b(99.99%) | 3-14b (99.99%) | 402 | Present invention |

As is clear from Table 2, the organic EL element of the present invention exhibits longer light emission lifetime in comparison to the organic EL elements in Comparative example.

Example 3

Preparation of Organic EL Element 3-1

Preparation of White-Illuminating Device

Organic EL element 3-1 was prepared similarly to preparation of organic EL element 1-1, except that 30 mg of dopant compound Ir-1 contained in a light emission layer was replaced by 9 mg of Ir-1, 9 mg of Ir-9 and 12 mg of Ir-14 in preparation of organic EL element 1-5 in Example 1.

When electricity was applied to this element, while light was obtained, and it was confirmed that the element was usable as an illuminating device.

Example 4

Synthesis of Compound 51a

Comparative Organic Electroluminescent Element Material

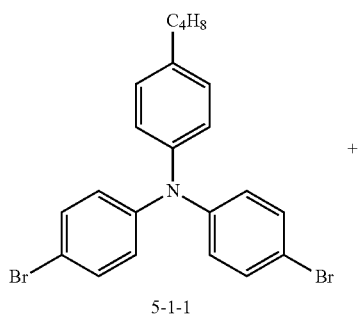

5-1-1

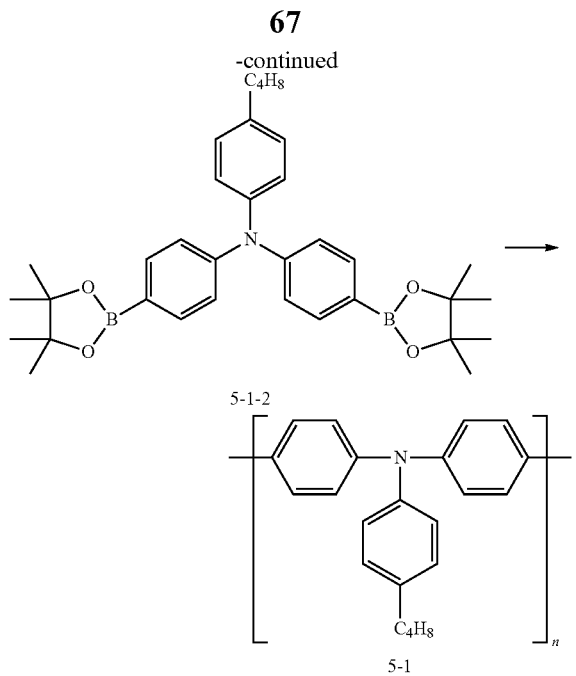

In 200 mL of toluene, dissolved were 15.0 g of compound 5-1-1 (HPLC purity of 99.65%) and 18.0 g of compound 5-1-2 (HPLC purity of 99.82%), followed by addition of 1.0 g of Aliquat 336 and 30 mL of a 2 mol/L sodium hydrogen carbonate solution under nitrogen atmosphere.

After vigorously stirring this mixture, and heating it via inflow for 20 hours, 1 g of bromobenzene was added, followed by heating for 5 hours. This traction solution was cooled to 60° C., and slowly added in a mixed solution of 3 L of methanol and 300 mL of pure water while stirring.

A precipitate was filtrated and repeatedly washed with methanol and pure water, and subsequently dried in a vacuum oven at 60° C. for 10 hours to obtain 19.0 g of compound 5-1a as a comparative organic electroluminescent element material. Spectral characteristics of compound 5-1a coincided with those of compound 5-1.

Synthesis of Compound 5-1b

Organic Electroluminescent Element Material of the Present Invention

Nineteen grams of compound 5-1b as an organic electroluminescent element material of the present invention were prepared similarly to synthesis of compound 5-1a as a comparative organic electroluminescent element material, except that employed were 5-1-1 (HPLC purity of 99.99%) and 5-1-2 (HPLC purity of 99.99%) each as a high purity monomer having an impurity content of 1000 ppm or less.

Preparation of Organic EL Element 5-1

Comparative Example

A substrate (NA45, produced by NH Techno Glass Corp.), prepared by forming a 150 nm thick ITO (indium tin oxide) film as an anode on a glass plate, was subjected to patterning, and a transparent supporting substrate provided with this ITO transparent electrode was cleaned with isopropyl alcohol via ultrasonic waves, followed by being dried employing dry nitrogen gas and being cleaned for 5 minutes employing UV ozone.

This substrate was moved in nitrogen atmosphere, and a solution in which 60 mg of compound 5-1a as a comparative organic EL element material were dissolved in 6 mL of toluene was coated by a spin coating method to form a film at 1,000 rpm for 30 seconds, followed by drying in vacuum at 150° C. for one hour to form a hole transport layer having a film thickness of 30 nm.

Subsequently, a solution in which 60 mg of H1 and 6.0 mg of Ir-12 were dissolved in 6 mL of toluene was coated on the hole transport layer by a spin coating method to form a film at 1,000 rpm for 30 seconds, followed by heating in vacuum at 150° C. for one hour to obtain a light emission layer having a film thickness of 40 nm.

Further, a solution in which 20 mg were dissolved in 6 mL of butanol was coated by a spin coating method to form a film at 1,000 rpm for 30 seconds, followed by heating in vacuum at 150° C. for one hour to obtain the first electron transport layer having a film thickness of 20 nm.

Next, this substrate was fixed on a substrate holder in a vacuum evaporator, and inside the vacuum evaporator, 200 mg of $Alq_3$ were charged in a molybdenum resistance heating boat. After depressurizing the vacuum chamber to $4 \times 10^{-4}$ Pa, the foregoing healing boat in which $Alq_3$ was charged was heated via electricity application to conduct evaporation on the foregoing first electron transport layer at a deposition rate of 0.1 nm/sec to form the second electron transport layer having a film thickness of 40 nm.

In addition, the substrate temperature during evaporation was room temperature. Subsequently, lithium fluoride and aluminum were deposited so as to give thicknesses of 0.5 nm and 110 nm, respectively to form a cathode. Thus, organic EL element 5-1 (Comparative example) was prepared.

Preparation of Organic EL Element 5-2

The Present Invention

Organic EL element 5-2 was prepared similarly to preparation of organic EL element 5-2, except that compound 5-1a as a comparative organic EL element material was replaced by compound 5-1b as an organic electroluminescent element material of the present invention.

Evaluation of Organic EL Element

As to evaluations of the resulting organic EL elements 5-1 and 5-2, the evaluations were made by the same method as used in Example 1. The values of externally taking-out quantum efficiency and light emission lifetime are represented by the relative values when those of organic EL element 5-1 each is set to 100.

The obtained results are shown below.

| Organic EL element No. | Hole transport material | Externally taking-out quantum efficiency | Light emission lifetime | Remarks |
|---|---|---|---|---|
| 5-1 | 5-1a | 100 | 100 | Comparative example |
| 5-2 | 5-1b | 102 | 321 | Present invention |

As is clear from the above-described, it is to be understood that organic EL element 5-2 prepared with 5-1b as an organic EL element material of the present invention exhibits drastically longer light emission lifetime in comparison to organic EL element 5-1 as a comparative example.

The invention claimed is:

1. A method of manufacturing an organic electroluminescent element comprising a substrate, a hole transport layer containing a polymer, and a light emission layer containing a phosphorescence dopant, the method comprising the steps of:
purifying a monomer with silica gel chromatography one or two times, followed by recrystallization two or three times to make a purified monomer having an impurity content of 1000 ppm or less;
synthesizing the polymer from at least the purified monomer having the impurity content of 1000 ppm or less via a halogen coupling reaction;
recovering the polymer;
forming the hole transport layer containing the polymer on the substrate by a wet coating process followed by a heating process; and
forming the light emission layer containing the phosphorescence dopant on the hole transport layer,
wherein the polymer comprises a partial structure represented by the following formula —Ar1-N(Ar3)-Ar2- wherein each of Ar1 and Ar2 independently represents an arylene group or a heteroarylene group, and Ar3 represents an aromatic hydrocarbon group or an aromatic heterocyclic group.

2. The method of manufacturing an organic electroluminescent element of claim 1,
wherein, in the step of purifying the monomer, the recrystallization is conducted three times.

* * * * *